US012610462B2

(12) United States Patent
Ahn et al.

(10) Patent No.: US 12,610,462 B2
(45) Date of Patent: Apr. 21, 2026

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Sang Min Ahn, Suwon-si (KR); Gyoo Tae Bae, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 272 days.

(21) Appl. No.: 18/632,621

(22) Filed: Apr. 11, 2024

(65) Prior Publication Data

US 2025/0031304 A1     Jan. 23, 2025

(30) Foreign Application Priority Data

Jul. 19, 2023     (KR) ........................ 10-2023-0093569

(51) Int. Cl.
H05K 1/03          (2006.01)
H05K 1/11          (2006.01)
(52) U.S. Cl.
CPC ........... H05K 1/0306 (2013.01); H05K 1/115 (2013.01); H05K 2201/096 (2013.01)
(58) Field of Classification Search
CPC . H05K 1/0306; H05K 1/115; H05K 2201/096

USPC .......................................................... 174/258
See application file for complete search history.

(56) References Cited

U.S. PATENT DOCUMENTS

| | | | |
|---|---|---|---|
| 2017/0006700 A1 | 1/2017 | Kim et al. | |
| 2019/0121189 A1* | 4/2019 | Hara | ................... H10D 86/0221 |
| 2022/0271208 A1* | 8/2022 | Li | ......................... H10H 20/857 |

FOREIGN PATENT DOCUMENTS

KR     10-2017-0004260 A     1/2017

* cited by examiner

*Primary Examiner* — Andargie M Aychillhum
(74) *Attorney, Agent, or Firm* — MORGAN, LEWIS & BOCKIUS LLP

(57)          ABSTRACT

A printed circuit board includes a glass layer having a first side surface and a second side surface, opposing each other in a first direction, a third side surface and a fourth side surface, opposing each other in a second direction, a first corner portion connecting the first side surface and the third side surface to each other, a second corner portion connecting the first side surface and the fourth side surface to each other, a third corner portion connecting the second side surface and the third side surface to each other, and a fourth corner portion connecting the second side surface and the fourth side surface to each other; a first insulating layer covering at least a portion of at least one side surface of the first to fourth side surfaces; and a second insulating layer covering at least one of the first to fourth corner portions.

27 Claims, 29 Drawing Sheets

PRINTED CIRCUIT BOARD AND METHOD OF MANUFACTURING THE SAME

CROSS-REFERENCE TO RELATED APPLICATION(S)

This application claims benefit of priority to Korean Patent Application No. 10-2023-0093569 filed on Jul. 19, 2023 in the Korean Intellectual Property Office, the disclosure of which is incorporated herein by reference in its entirety.

TECHNICAL FIELD

The present disclosure relates to a printed circuit board and a method of manufacturing the printed circuit board.

A multi-chip package including memory chips such as a High Bandwidth Memory (HBM) for processing exponentially increased data, processor chips such as Central Processing Unit (CPU), Graphics Processing Unit (GPU), Application Specific Integrated Circuit (ASIC), Field Programmable Gate Array (FPGA), and the like, has been being used due to recent developments in artificial intelligence (AI) technology, and the like. Accordingly, attempts to use glass materials are continuing. However, when glass materials are used, there is a high possibility of defects due to damage such as cracking or the like and in detail, finished products containing glass materials are vulnerable to impact at the stage of singulation.

SUMMARY

An aspect of the present disclosure is to provide a printed circuit board including a glass layer and a method of manufacturing the printed circuit board.

An aspect of the present disclosure is to provide a printed circuit board with a low probability of damage even when singulated, and a method of manufacturing the printed circuit board.

An aspect of the present disclosure is to provide a printed circuit board and a method of manufacturing the printed circuit board, in which reliability may be improved.

According to an aspect of the present disclosure, a printed circuit board includes a glass layer having a first side surface and a second side surface, opposing each other in a first direction, a third side surface and a fourth side surface, opposing each other in a second direction, perpendicular to a stacking direction and the first direction, a first corner portion connecting the first side surface and the third side surface to each other, a second corner portion connecting the first side surface and the fourth side surface to each other, a third corner portion connecting the second side surface and the third side surface to each other, and a fourth corner portion connecting the second side surface and the fourth side surface to each other; a first insulating layer disposed on the glass layer and covering at least a portion of at least one side surface of the first to fourth side surfaces; and a second insulating layer disposed on the first insulating layer and covering at least one of the first to fourth corner portions.

According to an aspect of the present disclosure, a printed circuit board includes a glass layer having a first side surface and a second side surface, opposing each other in a first direction, a third side surface and a fourth side surface, opposing each other in a second direction, perpendicular to a stacking direction and the first direction, a first corner portion connecting the first side surface and the third side surface to each other, a second corner portion connecting the first side surface and the fourth side surface to each other, a third corner portion connecting the second side surface and the third side surface to each other, and a fourth corner portion connecting the second side surface and the fourth side surface to each other; and an insulating material disposed on the glass layer and covering the first to fourth side surfaces and the first to fourth corner portions. At least one of the first to fourth corner portions has a plurality of edges.

According to an aspect of the present disclosure, a printed circuit board includes a glass layer having an upper surface and a lower surface opposing each other in one direction and a first side surface and a second side surface opposing each other in another direction; a first insulating layer disposed on the glass layer to cover the upper surface and a portion of the first and second side surfaces; a second insulating layer disposed on the first insulating layer and extending to cover another portion of the first and second side surfaces; a through-via penetrating through the glass layer; a first wiring layer disposed on the first insulating layer and covered by the second insulating layer; and a first via penetrating through the first insulating layer to connect the first wiring layer and the through-via to each other. At an interface of the first via and the through-via, a width of the first via is different from a width of the through-via.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
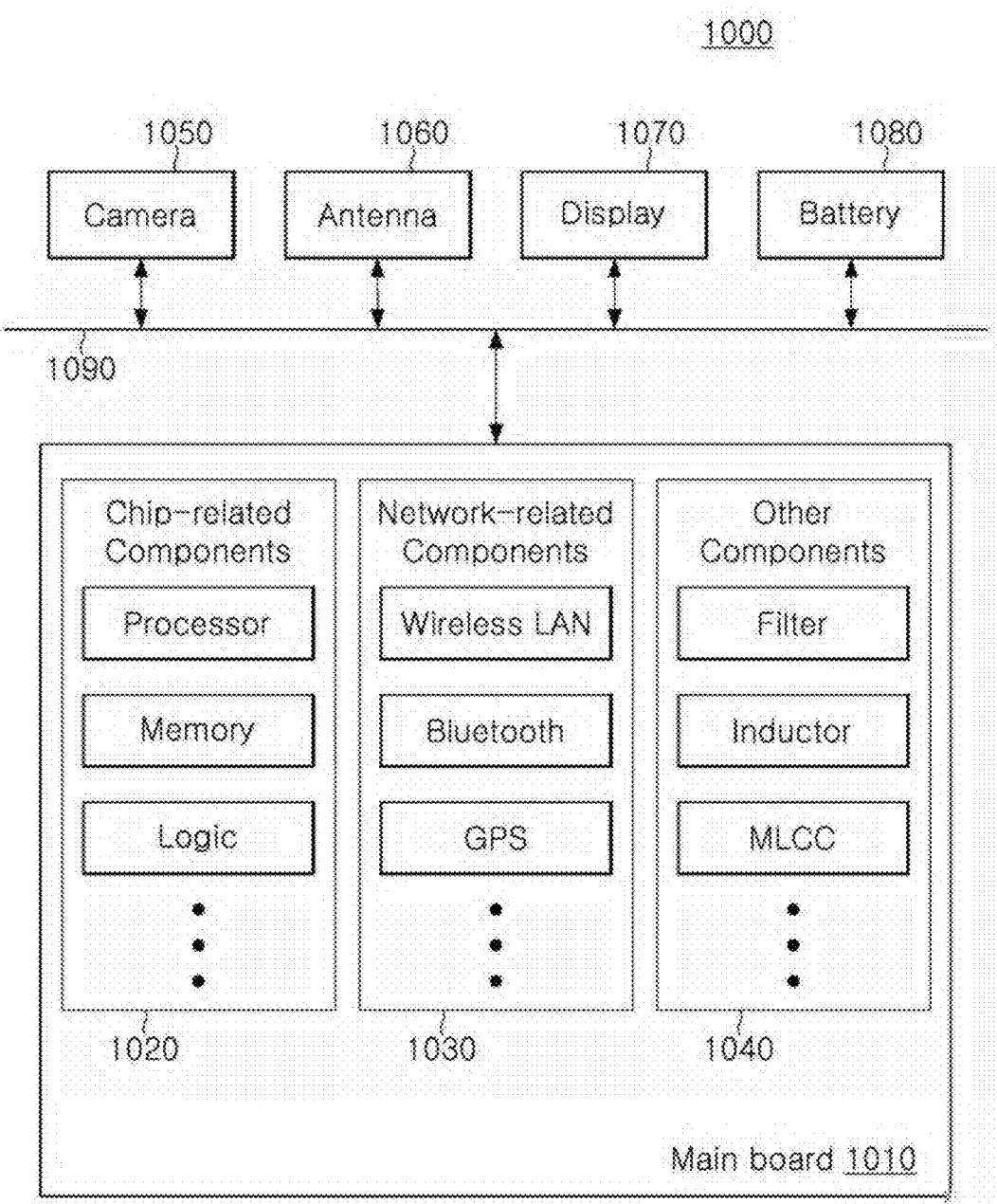
FIG. 1 is a block diagram schematically illustrating an example of an electronic device system.

Hereinafter, the present disclosure will be described with reference to the accompanying drawings. The shapes and sizes of elements in the drawings may be exaggerated or reduced for clearer descriptions.

Electronic Device

FIG. 1 is a block diagram schematically illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related electronic components. In addition, the chip related components 1020 may also be combined with each other. The chip related components 1020 may be in the form of a package including the above-described chips or electronic components.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive elements in the form of chip components used for various other purposes, or the like. In addition, other components 1040 may also be combined with each other, with the chip related components 1020 or the network related components 1030 described above.

Depending on a type of the electronic device 1000, the electronic device 1000 may include other electronic components that may or may not be physically or electrically connected to the mainboard 1010. These other electronic components may include, for example, a camera module 1050, an antenna module 1060, a display device 1070, a battery 1080, and the like. However, these other electronic components are not limited thereto, and may also be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, other electronic components for various uses may also be included depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
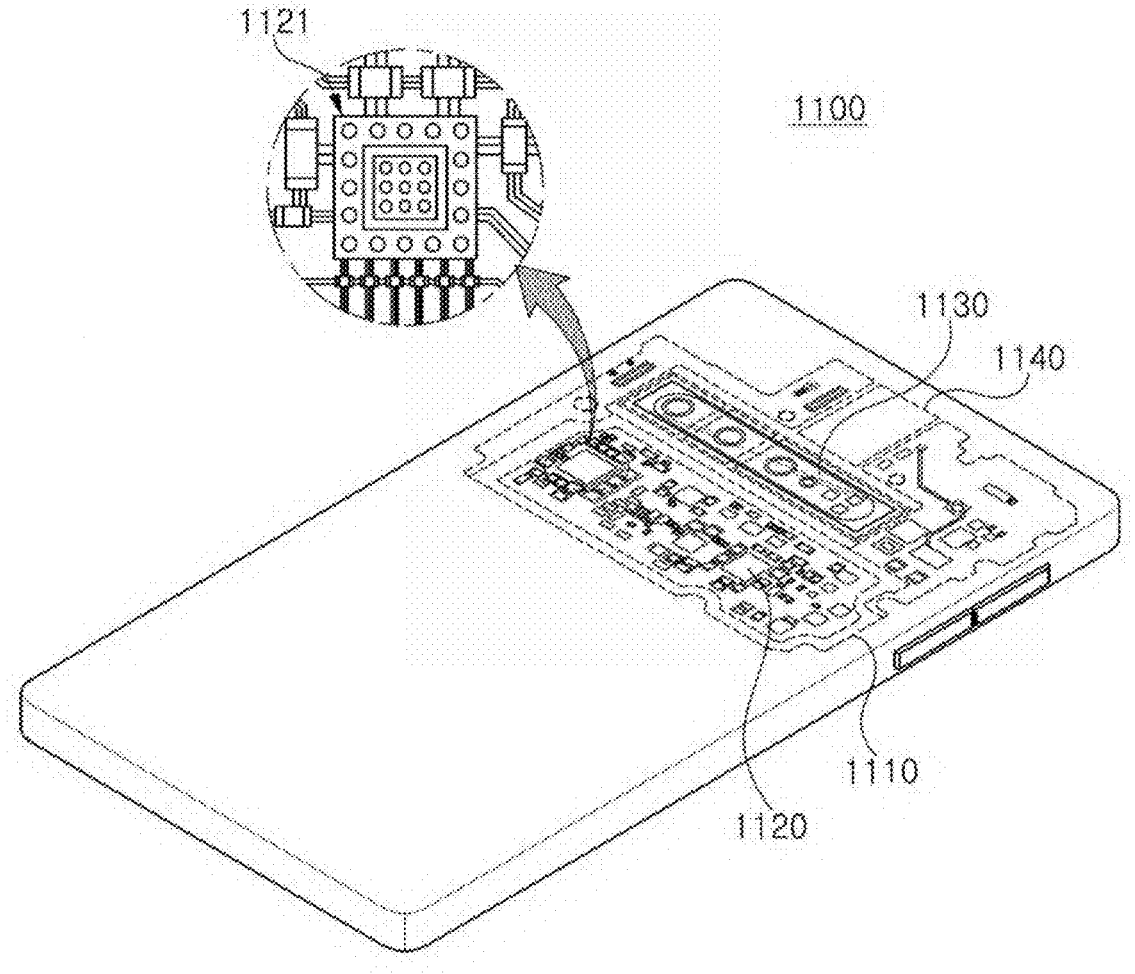
FIG. 2 is a perspective view schematically illustrating an example of an electronic device.

FIG. 2 is a schematic perspective view illustrating an example of an electronic device.

Referring to FIG. 2, the electronic device may be, for example, a smartphone 1100. A motherboard 1110 is accommodated inside the smartphone 1100, and various components 1120 are physically or electrically connected to the motherboard 1110. In addition, other components that may or may not be physically or electrically connected to the motherboard 1110, such as a camera module 1130 and/or a speaker 1140, may be accommodated therein. Some of the electronic components 1120 may be the above-described chip related components, for example, a component package 1121, but are not limited thereto. The component package 1121 may be in the form of a printed circuit board on which electronic components including active components and/or passive components are surface mounted. Alternatively, the component package 1121 may be in the form of a printed circuit board in which active components and/or passive components are embedded. On the other hand, the electronic device is not necessarily limited to the smartphone 1100, and may also be other electronic devices as described above.

Printed Circuit Board

Figure 3A:
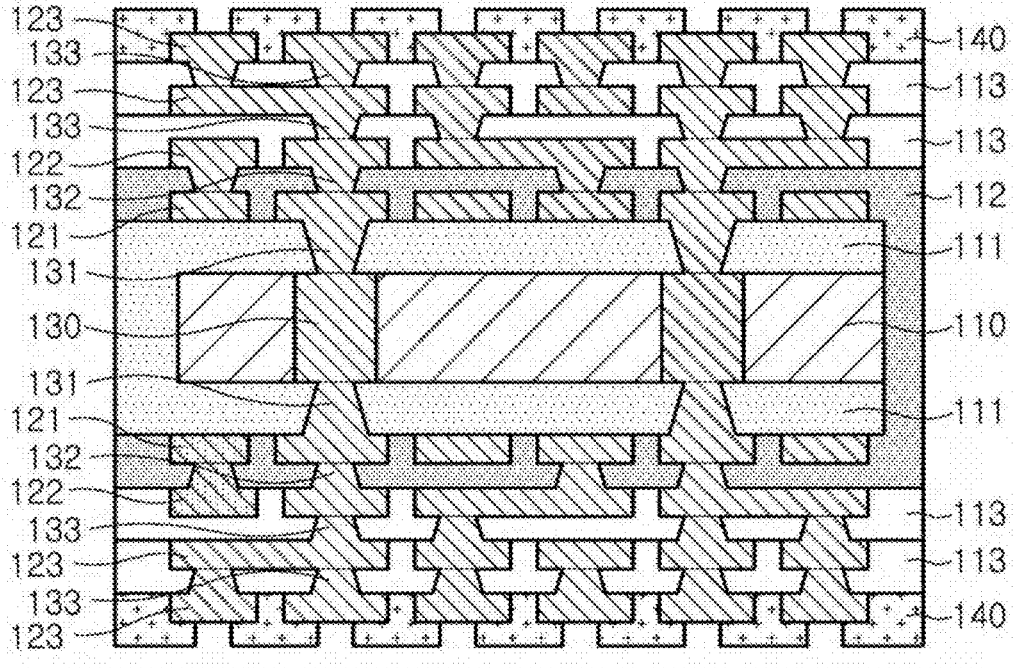
FIG. 3A is a cross-sectional view schematically illustrating an example of a printed circuit board.

FIG. 3A is a cross-sectional view schematically illustrating an example of a printed circuit board.

Referring to FIG. 3A, the printed circuit board according to an example may include a glass layer 110, a first insulating layer 111 disposed on the glass layer 110 and covering a portion of the side surface of the glass layer 110, and a second insulating layer 112 disposed on the first insulating layer 111 and covering the remaining portion of the side surface of the glass layer 110. A printed circuit board according to an example may include a through-via 130 penetrating through the glass layer 110, a first wiring layer 121 disposed on the first insulating layer 111, a first via layer 131 penetrating through the first insulating layer 111 to connect the first wiring layer 121 and the through-via 130 to each other, a second wiring layer 122 disposed on the second insulating layer 112, and a second via layer 132 penetrating through the second insulating layer 112 to connect the second wiring layer 122 and the first wiring layer 121 to each other.

The printed circuit board according to an example includes a glass layer 110, and may basically have excellent flatness, and additionally, may be advantageous for warpage control through low coefficient of thermal expansion (CTE). In detail, the printed circuit board according to an example may have the glass layer 110 as a core layer, and may thus be advantageous for warpage control even in the operation of stacking other insulating layers. In addition, since the first insulating layer 111 and the second insulating layer 112 are sequentially stacked on the glass layer 110, the flatness may be further increased. Therefore, it may be more advantageous for forming high-density fine circuits with fine pitch. In addition, the number of layers of the printed circuit board may be reduced and the degree of design freedom may be further increased through the dielectric properties of the glass layer 110, such as the characteristic of glass having a variable Dk of 2.5 to 11.

The printed circuit board according to an example has a structure that may reduce the risk of damage occurring in the operation of cutting the glass layer 110 into individual glass layers. The manufacturing stage of the printed circuit board including the glass layer 110 has a high risk of damage occurring during the single unitization process. The printed circuit board according to an example may protect the glass layer 110 by forming through-holes in the glass layer 110 in stages, and in the single unitization process, the cut is made to pass through the insulating layer that fills the through-hole, thus lowering the risk of damage. For example, the side surface of the glass layer 110 may be covered by each of the first insulating layer 111 and the second insulating layer 112, and the glass layer 110 may not be exposed to the outside. After forming the first through-hole (h1) along the cutting line (u) of the unit area, the first insulating layer 111 is stacked, and since the second insulating layer 112 is stacked after forming the second through-hole (h2), the side surface of the glass layer 110 may not be exposed to the outside, and this will be described in more detail later during the manufacturing stage.

The glass layer 110 may include glass, which is an amorphous solid. Glass may include, for example, pure silicon dioxide (about 100% SiO2), soda lime glass, borosilicate glass, alumino-silicate glass, etc., but the present disclosure is not limited thereto, and alternative glass materials such as fluorine glass, phosphate glass, chalcogen glass, etc. may also be used as materials for the glass layer 110. Additionally, other additives may be further included to form glass with specific physical properties. These additives include calcium carbonate (for example, lime) and sodium carbonate (for example, soda), as well as magnesium, calcium, manganese, aluminum, lead, boron, iron, chromium, potassium, sulfur and antimony, and these elements. and carbonates and/or oxides of other elements. The glass layer 110 is a layer that is distinct from materials containing glass fiber (glass fiber, glass cloth, glass fabric), such as copper clad laminate (CCL), prepreg (PPG), etc. and for example, may be understood as plate glass, or the like.

The first insulating layer 111 and the second insulating layer 112 may each include an organic insulating material. Organic insulating materials may include thermosetting resins such as epoxy resins, thermoplastic resins such as polyimide, or materials containing resins along with inorganic fillers, organic fillers, and/or glass fibers (Glass Fiber, Glass Cloth, Glass Fabric). For example, the insulating material may be a non-photosensitive insulating material such as Ajinomoto Build-up Film (ABF) or Prepreg (PPG), but is not limited thereto. In addition, other polymer materials may be used. Additionally, the insulating material may be a photosensitive insulating material such as Photo Imagable Dielectric (PID). Additionally, the insulating material may include an adhesive sheet such as Bonding Sheet (BS).

The first insulating layer 111 and the second insulating layer 112 may include the same insulating material. In detail, the first insulating layer 111 and the second insulating layer 112 may each include Ajinomoto Build-up Film (ABF), but are not limited thereto, and may also contain other organic insulating materials. In addition, the first insulating layer 111 and the second insulating layer 111 may include different materials.

The first wiring layer 121 and the second wiring layer 122 may each include a metal. The metal may include copper (Cu), aluminum (Al), silver (Ag), tin (Sn), gold (Au), nickel (Ni), lead (Pb), titanium (Ti), and/or alloys thereof. In detail, the metal may include copper (Cu), but the present disclosure is not limited thereto. The first wiring layer 121 and the second wiring layer 122 may each perform various functions depending on the design. For example, the first wiring layer 121 and the second wiring layer 122 may include signal patterns, power patterns, ground patterns, and the like. Each of these patterns may have various forms such as lines, planes, and pads. The first wiring layer 121 and the second wiring layer 122 may include an electroless plating layer (or chemical copper) and an electrolytic plating layer (or electrical copper), respectively, or may include a metal foil (or copper foil) and an electrolytic plating layer (or electrolytic copper). Alternatively, the first wiring layer 121 and the second wiring layer 122 may include a metal foil (or copper foil), an electroless plating layer (or chemical copper), and an electrolytic plating layer (or electrolytic copper). A sputtering layer may be included instead of an electroless plating layer (or chemical copper), and both may be included if necessary.

The through-via 130 may include a metal. The metal may include copper (Cu), aluminum (Al), silver (Ag), tin (Sn), gold (Au), nickel (Ni), lead (Pb), titanium (Ti), alloys thereof, and/or the like. In detail, the metal may include copper (Cu), but the present disclosure is not limited thereto. The through-via 130 may penetrate between the upper and lower surfaces of the glass layer 110. The upper and lower surfaces of the through-via 130 may substantially coplanar with the upper and lower surfaces of the glass layer 110. In FIG. 3A, the through-via 130 is illustrated as a so-called filled via that penetrates the upper and lower surfaces of the glass layer 110 and is filled with a single metal layer; however, the present disclosure is not limited thereto. The specific method of forming the through-via 130, which may be a conformal via disposed along the wall of the via hole, is not limited thereto. The through-via 130 may perform various functions depending on the design, and for example, may include ground vias, power vias, signal vias, and the like. The through-via 130 may have a substantially circular, elliptical, or polygonal shape on a plane, but the present disclosure is not limited thereto. For example, in terms of securing adhesion by increasing the specific surface area, it may have a complex shape where various shapes are combined into one on a plane. The side surface of the through-via 130 may be substantially perpendicular to the upper and lower surfaces of the through-via 130, but is not limited thereto, and may be tapered to have an hourglass shape in cross section, if necessary.

The first via layer 131 and the second via layer 132 may each include a metal. The metal may include copper (Cu), aluminum (Al), silver (Ag), tin (Sn), gold (Au), nickel (Ni), lead (Pb), titanium (Ti), and/or alloys thereof, etc., and in detail, may include copper (Cu), but is not limited thereto. The first via layer 131 and the second via layer 132 may each include a filled via that fills the via hole, but may also include a conformal via disposed along the wall of the via hole. The first via layer 131 and the second via layer 132 may perform various functions depending on the design, and or example, may include ground vias, power vias, signal vias, etc. The first and second connection vias 132 and 133 may include an electroless plating layer (or chemical copper) and an electrolytic plating layer (or electrical copper), respectively. A sputtering layer may be included instead of an electroless plating layer (or chemical copper), and both may be included if necessary.

The first via layer 131 disposed on the upper surface of the glass layer 110 and the first via layer 131 disposed on the lower surface of the glass layer 110 may have tapered shapes in opposite directions in cross section. This is a characteristic that may occur because the printed circuit board according to the example is a so-called core type printed circuit board with the glass layer 110 as the core layer, and since the first via layer 131 is formed by forming each via hole in the first insulating layer 111 laminated on the upper and lower surfaces of the glass layer 110, each of the first via layers 131 disposed above and below the glass layer 110 may have different tapered directions. In more detail, as it approaches the glass layer 110, the width of the first via layer 131 in the cross section may become narrower.

On the other hand, in the printed circuit board according to an example, the upper and lower surfaces of the through-vias 130 penetrating through the glass layer 110 may be directly connected to the lower and upper surfaces of the first via layer 131, respectively. This is because it is difficult to secure adhesion to metal materials on the upper and lower surfaces of the glass layer 110, making it difficult to form a wiring layer directly. After the first insulating layer 111 is formed on the upper and lower surfaces of the glass layer 110, the first wiring layer 121 is formed on the first insulating layer 111, and the first wiring layer 121 may be connected to the through-via 130 through the first via layer 131.

On the other hand, the printed circuit board according to an example may further include a third insulating layer 113 disposed on the second insulating layer 112, a third wiring layer 123 disposed on the third insulating layer 113, and a third via layer 133 penetrating through the third insulating layer to connect the third wiring layer 123 and the second wiring layer 122. Each of the third insulating layer 113, third wiring layer 123, and third via layer 133 may include one or more layers and may include a plurality of insulating layers, wiring layers, and via layers.

The third insulating layer 113 may include an insulating material. The insulating material may include thermosetting resins such as epoxy resins, thermoplastic resins such as polyimide, or materials containing these resins along with inorganic fillers, organic fillers, and/or glass fibers (Glass Fiber, Glass Cloth, Glass Fabric). For example, the insulating material may be a non-photosensitive insulating material such as Ajinomoto Build-up Film (ABF) or Prepreg (PPG), but is not limited thereto. In addition, other polymer materials may be used. Additionally, the insulating material may be a photosensitive insulating material such as Photo Imagable Dielectric (PID). The third insulating layer 113 may include the same insulating material as the first insulating layer 111 and/or the second insulating layer 112, but is not limited thereto, and may include different insulating materials.

The third wiring layer 123 may include a metal. The metal may include copper (Cu), aluminum (Al), silver (Ag), tin (Sn), gold (Au), nickel (Ni), lead (Pb), titanium (Ti), and/or alloys thereof, etc. In detail, the metal may include copper (Cu), but is not limited thereto. The third wiring layer 123 may perform various functions depending on the design, and for example, may include signal patterns, power patterns, ground patterns, etc. Each of these patterns may have various forms such as lines, planes, and pads. The third wiring layer 123 may include an electroless plating layer (or chemical copper) and an electrolytic plating layer (or electrical copper). Alternatively, it may include a metal foil (or copper foil) and an electrolytic plating layer (or electrolytic copper). Alternatively, it may include a metal foil (or copper foil), an electroless plating layer (or chemical copper), and an electrolytic plating layer (or electrolytic copper). A sputtering layer may be included instead of an electroless plating layer (or chemical copper), and both may be included if necessary.

The third via layer 133 may include a metal. The metal may include copper (Cu), aluminum (Al), silver (Ag), tin (Sn), gold (Au), nickel (Ni), lead (Pb), titanium (Ti), and/or alloys thereof, etc., and in detail, may include copper (Cu), but is not limited thereto. The third via layer 133 may include a filed via that fills the via hole, but may also include a conformal via arranged along the wall of the via hole. The third via layer 133 may perform various functions depending on the design. For example, it may include ground vias, power vias, signal vias, etc. In the third via layer 133, the via layer disposed on the upper side surface of the glass layer 110 and the via layer disposed on the lower side surface of the glass layer 110 may have tapered shapes in opposite directions in the cross section. The third via layer 133 may include an electroless plating layer (or chemical copper) and an electrolytic plating layer (or electrolytic copper), respectively. A sputtering layer may be included instead of an electroless plating layer (or chemical copper), and both may be included if necessary.

On the other hand, the printed circuit board according to an example may further include a solder resist layer 140 on the third insulating layer 113. The solder resist layer 140 is disposed on the outermost side surface of the printed circuit board to protect the printed circuit board from the outside. The solder resist layer 140 may use a known solder resist, and the solder resist layer 140 may include a liquid or film type solder resist, but is not limited thereto, and may include other types of insulation, and may contain a thermosetting resin and an inorganic filler dispersed in the thermosetting resin, but may not contain glass fiber. The insulating resin may be a photosensitive insulating resin, and the filler may be an inorganic filler and/or an organic filler, but is not limited thereto. If necessary, other polymer materials may be used. The solder resist layer 140 may have an opening, and at least a portion of the third wiring layer 123 may be exposed through the opening. The third wiring layer 123 exposed through the opening may be connected to the main board or another printed circuit board, and may also be connected to other devices such as semiconductor chips. If necessary, a surface treatment layer may be further formed on the pattern exposed through the opening. Alternatively, metal bumps may be further formed on the pattern exposed through the opening.

On the other hand, the printed circuit board according to an example is not limited to the configuration illustrated in FIG. 3A, and may further include general configurations of printed circuit boards, and in detail, may include additional configurations that may be used by anyone with ordinary knowledge in the relevant technical field.

Figure 3B:
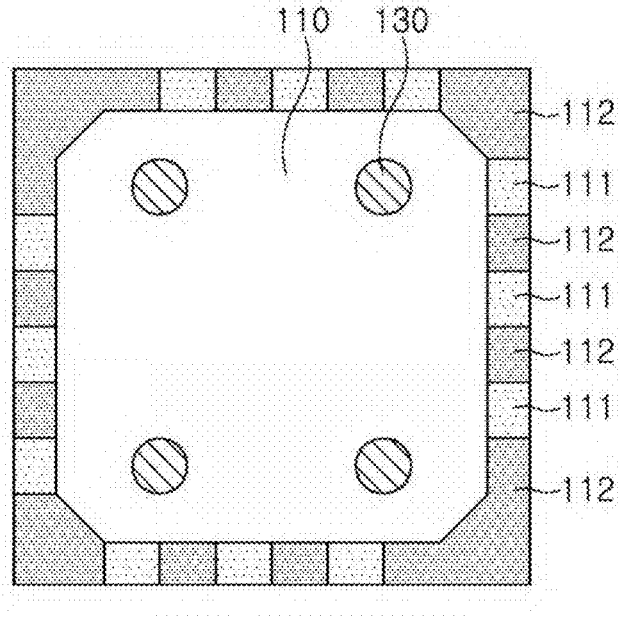
FIG. 3B is a top-view cross-sectional view of a glass layer of a printed circuit board, seen from above.

FIG. 3B is a top-view cross-sectional view of the glass layer 110 of the printed circuit board seen from above.

FIG. 3B may be a top-view cross-sectional view viewed from the top with the entire glass layer 110 separated, and may have the same cross-section even when cut horizontally between the upper and lower surfaces of the glass layer 110.

Referring to FIG. 3B, the side surface and corner portions of the glass layer 110 of the printed circuit board according to an example are covered by the first insulating layer 111 and the second insulating layer 112. The glass layer 110 may not be exposed to the outside of the printed circuit board. Portions of the side surface and corner portions of the glass layer 110 may be covered by the first insulating layer 111, and the remaining portion may be covered by the second insulating layer 112.

In more detail, the glass layer 110 may have a first side surface and a second side surface, opposing each other in a first direction perpendicular to the stacking direction, and may have a third side surface and a fourth side surface, opposing each other in a second direction perpendicular to the stacking direction and the first direction. In addition, the glass layer 110 may have a first corner portion connecting the first side surface and the third side surface to each other, a second corner portion connecting the first side surface and the fourth side surface to each other, a third corner portion connecting the second side surface and the third side surface to each other, and a fourth corner portion connecting the second side surface and the fourth side surface to each other. The first to fourth side surfaces are represented as edges of the glass layer in FIG. 3B, and the first to fourth corner portions are expressed as connecting lines connecting the corners on the corner portion side surface of the glass layer in FIG. 3B.

Referring to FIG. 3B, at least one of the first to fourth corner portions of the glass layer 110 may have a plurality of edges. An edge may be understood as an intersection that occurs when two surfaces meet. For example, the fact that the first corner portion where the first side surface and the third side surface are connected has one edge means that the first side surface and the third side surface come into direct contact to form one corner. In the printed circuit board according to an example, the first corner portion connecting the first side surface and the third side surface has a first corner portion surface that is different from the first side surface and the third side surface, and the first corner portion surface and the first side surface may have edges in contact with each other, and the first corner portion surface and the third side surface may have edges in contact with each other. In this manner, in the printed circuit board according to an example, the first corner portion may include a plurality of corners. On the other hand, when the first side surface and the third side surface are in direct contact, the edge due to the step caused by errors in the manufacturing stage, etc. is not understood as a plurality of edges. If the first corner portion has a separate corner portion surface that is distinct from the first side surface and the third side surface, and the first corner portion substantially includes a plurality of edges, it may be understood as having a plurality of edges.

On the other hand, the printed circuit board according to an example may have a first corner portion having a curved surface during the manufacturing stage. In this case, the discontinuous position where the extension surface of the first side surface and the first corner portion do not coincide may be understood as the starting point of the first corner, and at this time, the discontinuous position may be understood as one edge. In this case, since the first corner portion may have a discontinuous position that does not coincide with the extension surface of the first side surface and may have discontinuous positions that do not coincide with the extension surface of the third side surface, the first corner portion has corners at respective positions, and may be understood as having multiple edges.

On the other hand, without being limited thereto, the first corner portion may be understood as having a separate first corner portion surface that is substantially distinct from the first side surface and the third side surface, and this may be the result of processing to form a first corner portion in the operation of cutting along the first side surface and the operation of cutting along the third side surface in the manufacturing operation of the printed circuit board according to the example. On the other hand, the description of the relationship between the first side surface and the third side surface and the first corner portion may be applied to other side surfaces and other corner portions in the same sense. For example, this relationship may be equally applied to the second corner portion between the first and fourth side surfaces, and the same may be applied to the third corner portion between the second side surface and the third side surface, and the fourth corner portion between the second side surface and the fourth side surface.

Referring to FIG. 3B, on at least one of the first to fourth side surfaces of the glass layer 110, at least a portion of one side surface may be covered by the first insulating layer 111 and the remaining portion may be covered by the second insulating layer 112. The glass layer 110 may have a structure in which the first to second insulating layers 111 and 112 are alternately disposed on at least one of the first to fourth side surfaces. The area in which the first insulating layer 111 is disposed corresponds to the area in which the first through-hole h1 was formed in the manufacturing stage, and the area in which the second insulating layer 112 is disposed may correspond to the area in which the second through-hole h2 is formed. As the first through-holes (h1) and second through-holes (h2) having narrow widths are alternately arranged in the manufacturing stage, when forming a through-hole, the stress applied to the glass layer 110 may be distributed so that it is not concentrated. On the other hand, the first insulating layer 111 and the second insulating layer 112 may each have a narrower width and be arranged so that more units are repeated than illustrated in FIG. 3B.

Referring to FIG. 3B, at least one of the first to fourth corner portions of the glass layer 110 may be covered by the second insulating layer 112. As illustrated in FIG. 3B, the first to fourth corner portions may each be covered by the second insulating layer 112, but are not limited thereto, and may also be covered by the first insulating layer 111. The area in which the first insulating layer 111 is disposed corresponds to the area in which the first through-hole h1 was formed in the manufacturing stage, and as described above, the area in which the second insulating layer 112 is disposed corresponds to the area in which the second through-hole h2 is formed. For example, the first through-hole h1 formed first in the manufacturing step is formed on the first to fourth side surfaces of the glass layer 110, and the second through-hole h2 formed after forming the first insulating layer 111 may be formed in the area of the first to fourth corners of the glass layer 110. In the operation of forming the first through-hole (h1) in the glass layer 110, if the first through-hole (h1) is formed in the edge area of the glass layer 110, the stress applied to the glass layer 110 may be concentrated, and the risk of damage increases. Therefore, the first through-hole h1 is preferentially formed in the side surface area of the glass layer 110, and after forming the first insulating layer 111, the second through-hole (h2) may be formed in the region of the corner portion of the glass layer 110.

On the other hand, referring to FIG. 3B, at least one of the first to fourth corner portions may have an inclination, and may form an obtuse angle with the first to fourth side surfaces. FIG. 3B is a top-view cross-sectional view of the glass layer 110 of the printed circuit board viewed from above, and as described above, the cross section is oriented perpendicular to the stacking direction so as to pass through the glass layer 110. Therefore, as illustrated in FIG. 3B, the corner portions of the glass layer 110 may each form an obtuse angle with the side surface of the glass layer 110, and when removing part of the corner portion of the glass layer 110 to form the second through-hole (h2) in the manufacturing stage, because the corner portion of the glass layer 110 is removed together, this shape may occur. When forming the second through-hole h2, if the corners of the glass layer 110 are formed so that the side surfaces are perpendicular to each other, stress is concentrated in the corners. While there is a high risk of damage such as cracks occurring at the corners, when forming the second through-hole h2, if part of the corners of the glass layer 110 is removed together so that the corners form an obtuse angle with the side surface, in the operation of forming the second through-hole h2, stress may be distributed and the risk of damage may be reduced. On the other hand, in FIG. 3B, the slope of the corner portion is illustrated as a straight line so that it is substantially constant, but it is not limited to what is illustrated in FIG. 3B. The corner portion may have a convex slope or a concave slope. For example, the fact that the first corner portion has a convex slope may mean that the first corner portion protrudes further than the straight line connecting the first side surface and the third side surface, to have a convex curve, and having a concave slope means that it may have a concave curve to be opposite thereto. This may correspond to a case where the first corner portion has a curved surface. The explanation regarding this may be equally applied to the second to fourth corner portions.

At this time, the first insulating layer 111 and the second insulating layer 112 may have an interlayer boundary. The first insulating layer 111 and the second insulating layer 112 may include the same insulating material, but because they are formed at different manufacturing stages, the first insulating layer 111 formed earlier and the second insulating layer 112 formed later may have an interlayer boundary so that they may be distinguished from each other. For example, the first insulating layer 111 and the second insulating layer 112 may be distinguishable from each other on a cut surface of the printed circuit board.

On the other hand, in FIG. 3B, the first insulating layer 111 and the second insulating layer 112 are illustrated to be repeated with a constant width, but this is not limited thereto. The width of the first insulating layer 111 and the second insulating layer 112 may be adjusted depending on the design, and the widths of the first insulating layer 111 and the second insulating layer 112 may include errors in the manufacturing stage or measurement. Of course, the repeating units of the first insulating layer 111 and the second insulating layer 112 may also be adjusted.

Method of Manufacturing Printed Circuit Board

A method of manufacturing a printed circuit board according to an example may include forming a first through-hole (h1) and a via hole (h0) in the glass layer 110, forming a through-via 130, forming a first insulating layer 111 on the glass layer 110 by filling the first through-hole (h1), forming a first wiring layer 121 on the first insulating layer 111, forming a second through-hole (h2) through the first insulating layer 111 and the glass layer 110, forming a second insulating layer 112 on the first insulating layer 111 by filling the second through-hole (h2), and performing singulation. In addition, the method of manufacturing a printed circuit board may further include forming the second wiring layer 122 on the second insulating layer 112, forming the third insulating layer 113 on the second insulating layer 112, and forming a third wiring layer 123 on the third insulating layer 113.

Hereinafter, the manufacturing method of the printed circuit board according to an example will be described in more detail with reference to the drawings.

Figure 4A:
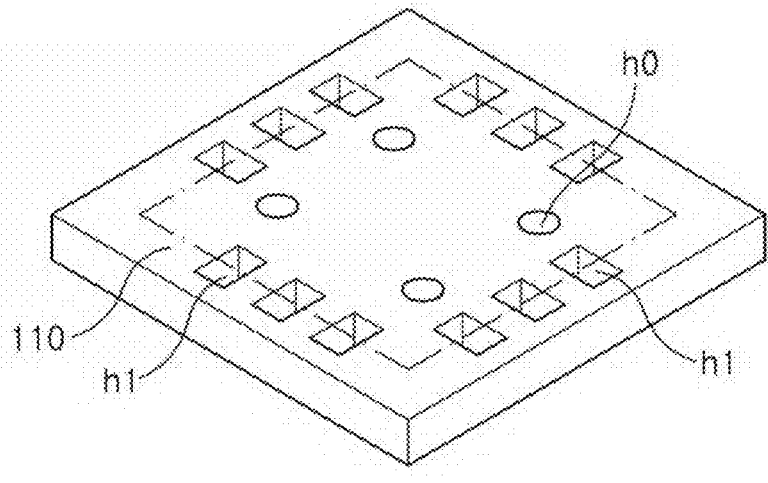
FIGS. 4A to 4D are perspective and cross-sectional views illustrating an operation of forming a first through-hole in a method of manufacturing a printed circuit board.
Figure 4B:
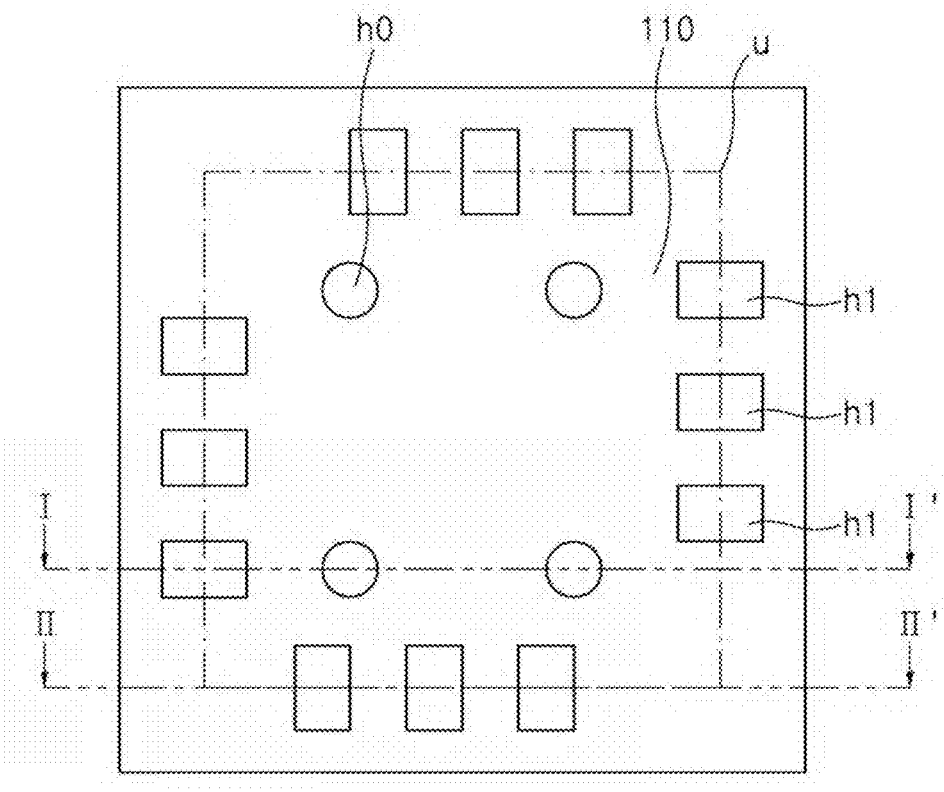
Figure 4C:
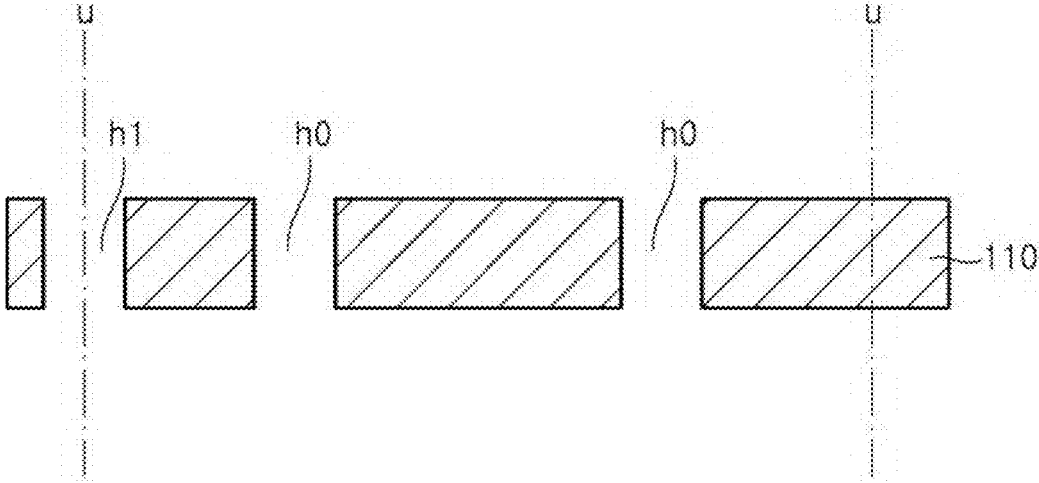
Figure 4D:
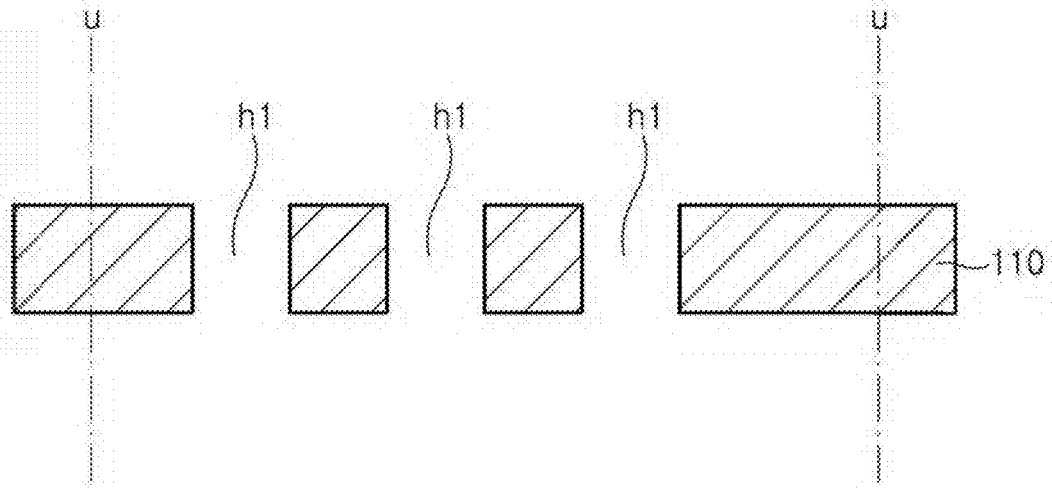

FIGS. 4A to 4D are exploded perspective and cross-sectional views illustrating the first through-hole h1 forming step in the printed circuit board manufacturing method. In detail, FIG. 4A is a perspective view, FIG. 4B is a top-view plan view, FIG. 4C is a cross-sectional view taken along line I-I' in FIG. 4B, and FIG. 4d is a cross-sectional view taken along line II-II' in FIG. 4B.

Referring to FIGS. 4A to 4D, a via hole h0 for the through-via 130 is formed in a unit area of the glass layer 110, and a first through-hole (h1) may be formed in a portion of the cutting line (u) for the unit area. At this time, the glass layer 110 may be in the form of a glass plate in strip units before being cut into unit areas, but is not limited thereto.

The unit area refers to the area in which the printed circuit board will be completed by performing the unification process. The cutting line (u) is an imaginary line where the unification process is performed and is the area that will be the outermost surface of the printed circuit board. Other components of the printed circuit board, such as through-vias, wiring layers, and via layers, are arranged within the cutting line (u), which is a unit area. The via hole (h0) is disposed within a unit area of the glass layer 110 and is formed in the area in which the through-via 130 is to be formed.

The first through-hole (h1) and via hole (h0) may be formed by various methods such as laser processing, mechanical processing, and chemical processing. Because the first through-hole (h1) is formed in a strip-unit glass plate, if the first through-hole h1 is too large or the first through-hole h1 is formed in an L shape orthogonal to the corner portion of the unit area, stress may be concentrated in the area in which the first through-hole h1 is formed. Accordingly, the first through-hole h1 is not disposed at a corner portion of the cutting line u, but is arranged at regular intervals along the corner portion of the cutting line u, so that stress may be distributed. At this time, when the first through-hole (h1) is placed as close to the corner portion as possible in accordance with the second through-hole (h2) formed at the corner portion of the cutting line (u), stress occurred while forming the second through-hole (h2) may be distributed.

The shape of the first through-hole h1 is expressed as having a rectangular shape when viewed from the top, but is not limited thereto, and may be a rectangular shape with a longer horizontal length, a circular shape, or an oval shape, but is not limited thereto and may have a regular polygonal shape such as a square or regular hexagon. Additionally, the through-hole may be formed to have a constant width in the cross-sectional view, but is not limited thereto.

In FIGS. 4A to 4D, the first through-hole h1 is expressed as three through-holes formed at each corner portion of the cutting line u, but the number of first through-holes h1 is not limited thereto. In addition, in the drawing, the width of the first through-hole (h1) and the distance between the first through-holes (h1) are expressed as being constant, but the present disclosure is not limited thereto. The width, spacing, and number may be adjusted within the range that may be changed by a person skilled in the art.

Figure 5A:
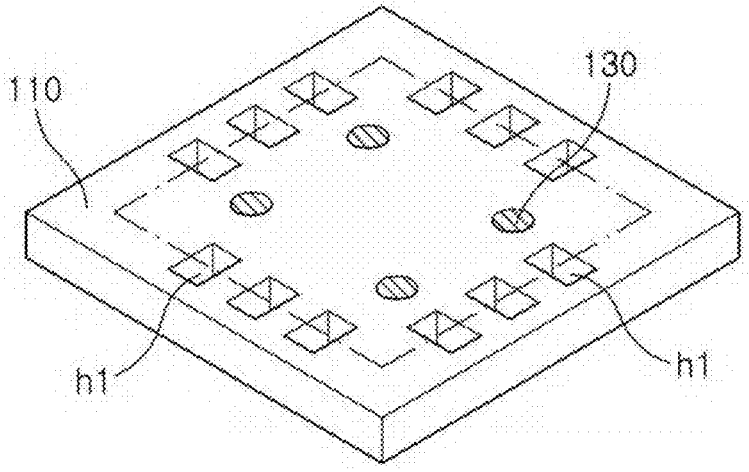
FIGS. 5A to 5D are perspective and cross-sectional views illustrating an operation of forming a through-via in a method of manufacturing a printed circuit board.
Figure 5B:
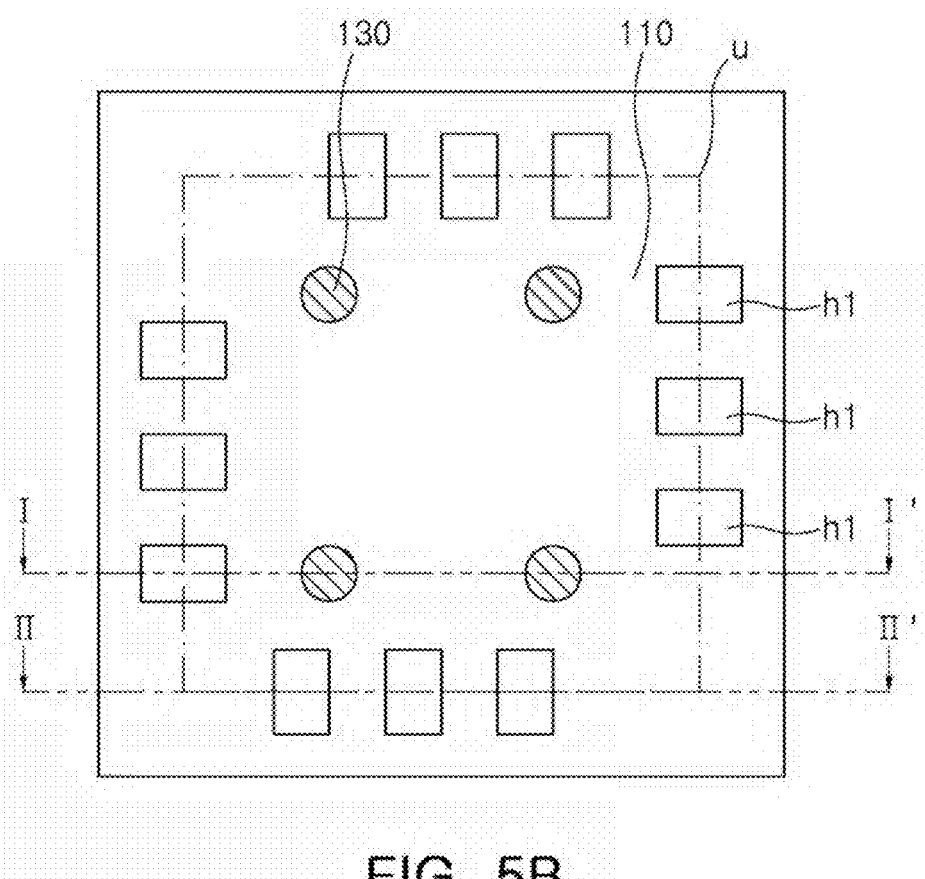
Figure 5C:
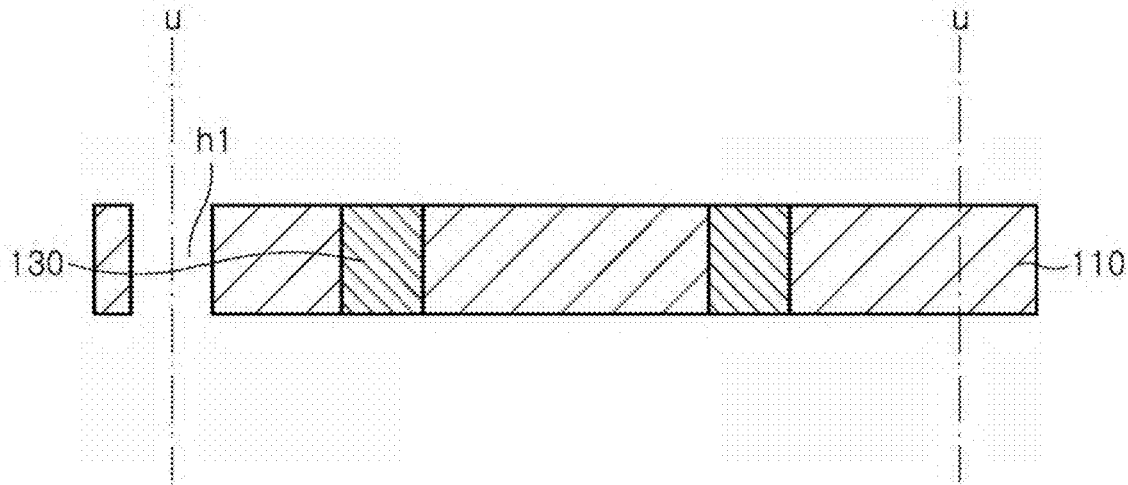
Figure 5D:
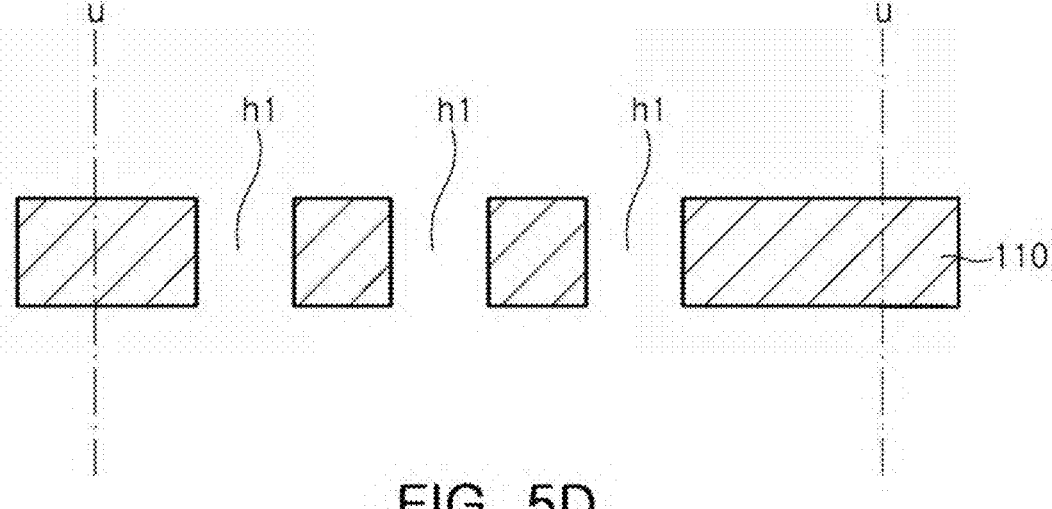

FIGS. 5A to 5D are perspective and cross-sectional views illustrating the operation of forming the through-via 130 in the method of manufacturing a printed circuit board. In detail, FIG. 5A is a perspective view, FIG. 5B is a top-view plan view, FIG. 5C is a cross-sectional view taken along line I-I' in FIG. 5B, and FIG. 5D is a cross-sectional view taken along line II-II' in FIG. 5B.

The through-via 130 is illustrated as a filled via filled with one metal layer, but is not limited thereto, and may be a conformal via disposed along the wall of the via hole. The through-via 130 may be filled by plating on the seed layer formed along the via hole h0, or may be formed by removing unnecessary parts, but the present disclosure is not limited thereto. Any method of forming the through-via 130 in the glass layer 110 may be used without limitation, such as filling the same with a paste containing a metal material and then performing firing thereon. In detail, a means to ensure adhesion between the glass layer 110 and the through-via 130 may be used.

Figure 6A:
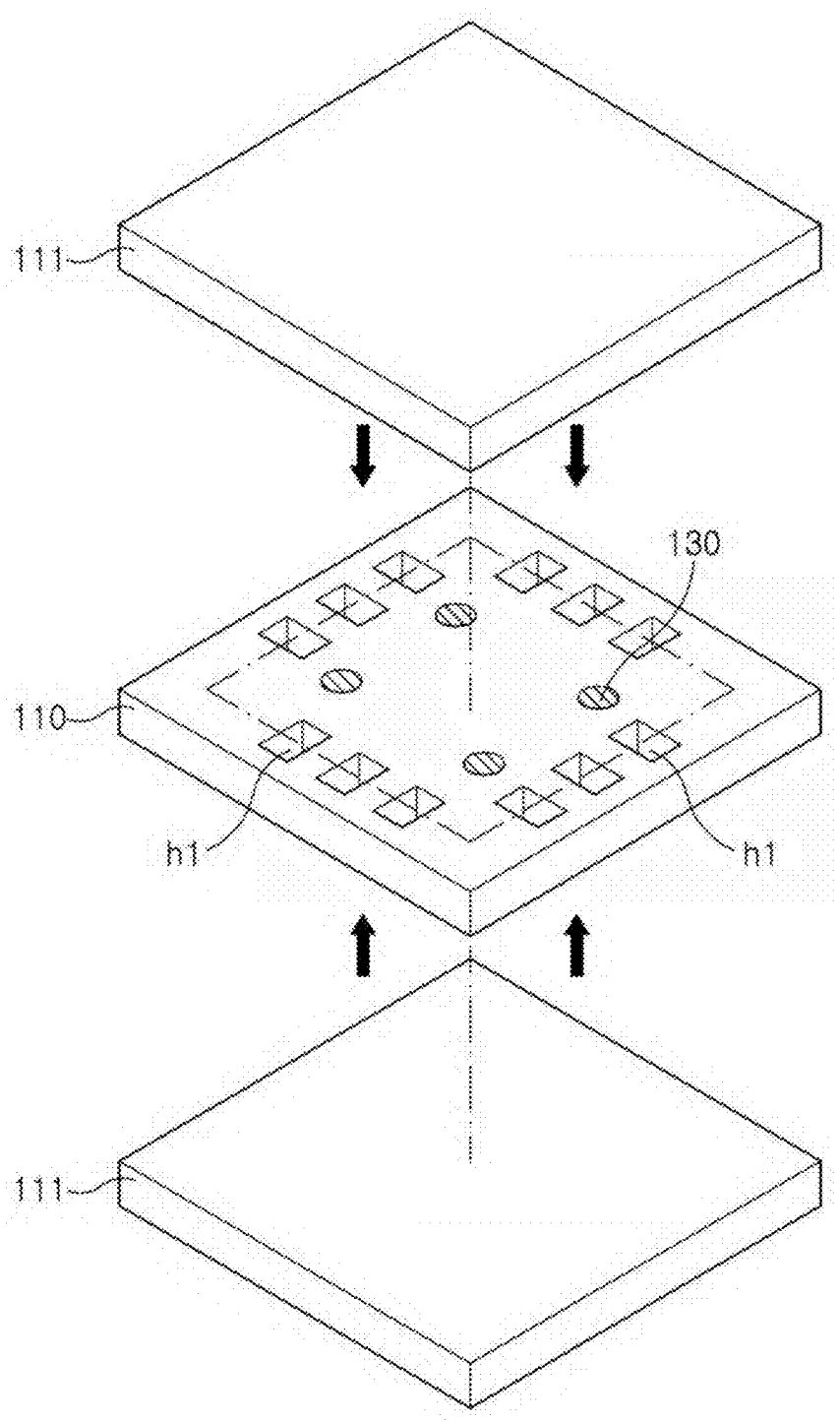
FIGS. 6A to 6D are exploded perspective and cross-sectional views illustrating an operation of forming a first insulating layer in a method of manufacturing a printed circuit board.
Figure 6B:
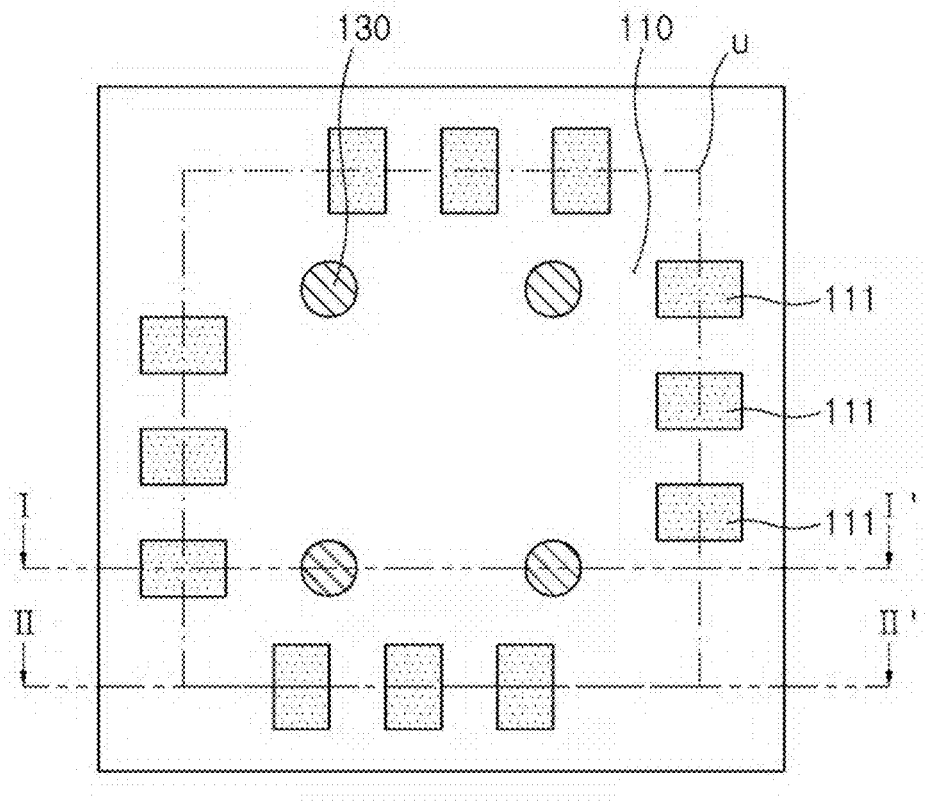
Figure 6C:
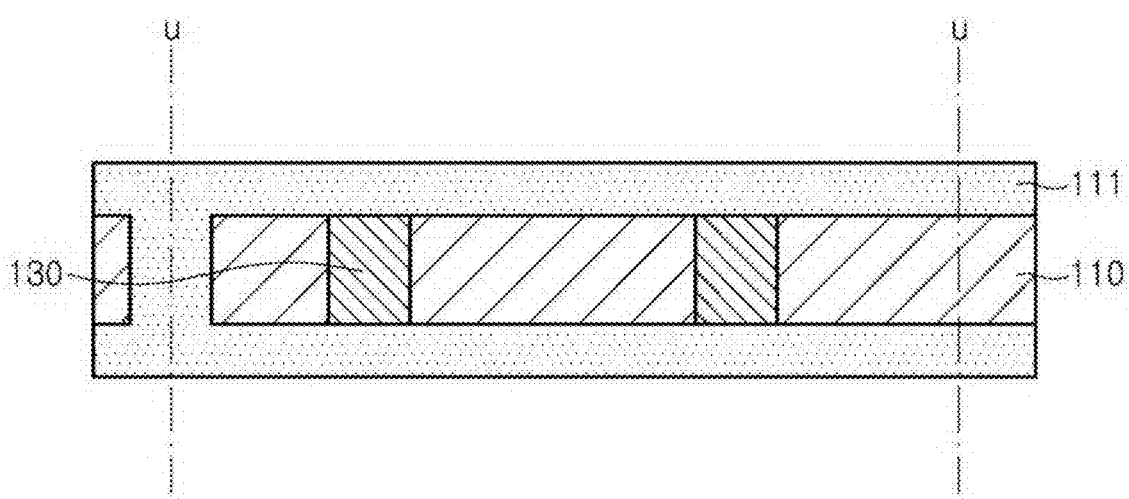
Figure 6D:
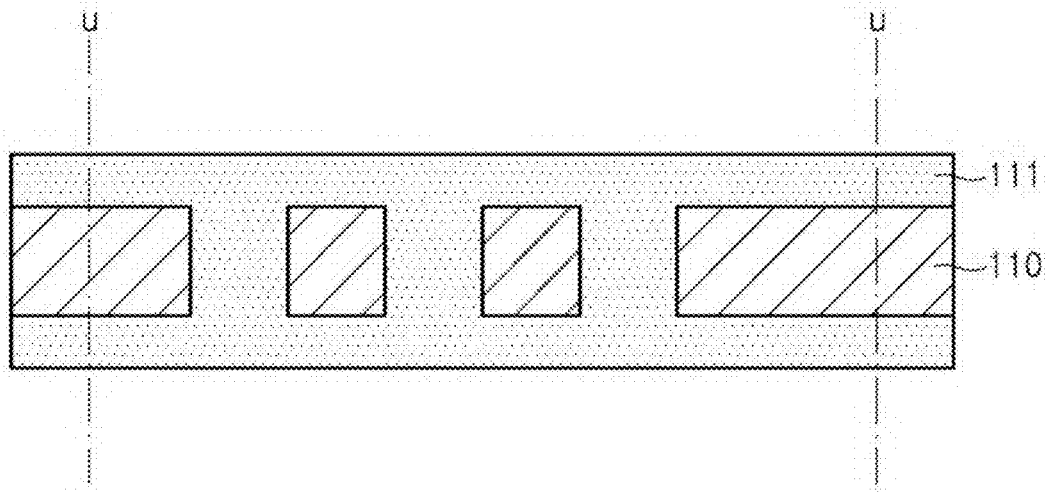

FIGS. 6A to 6D are perspective and cross-sectional views illustrating the operation of forming the first insulating layer 111 in the method of manufacturing a printed circuit board. In detail, FIG. 6A is an exploded perspective view, FIG. 6B is a top-view plan view of the glass layer 110, FIG. 6C is a cross-sectional view taken along line I-I' in FIG. 6B, and FIG. 6D is a cross-sectional view taken along line II-II' in FIG. 6B.

Referring to FIG. 6A, a first insulating layer 111 may be formed above and below the glass layer 110. The first insulating layer 111 may be in the form of a film containing an insulating material, but is not limited thereto. Before curing the first insulating layer 111, there may be flowability and the first through-hole h1 may be filled. The operation of forming the first insulating layer 111 may be performed by placing and curing the first insulating layer, but the present disclosure is not limited thereto. The operation of forming the first insulating layer 111 may be performed using a known method of stacking insulating layers on a printed circuit board.

As the first insulating layer 111 is formed to fill the first through-hole h1, a portion of the side surface of the glass layer 110 may be covered by the first insulating layer 111. In detail, referring to FIG. 6D, a portion of the side surface of the glass layer 110 may be covered by the first insulating layer 111, and the remaining portion may have a shape in which the glass layer 110 remains. The remaining portion corresponds to the area in which the second through-hole (h2) will be formed and filled by the second insulating layer 112 in a process to be described later.

Figure 7A:
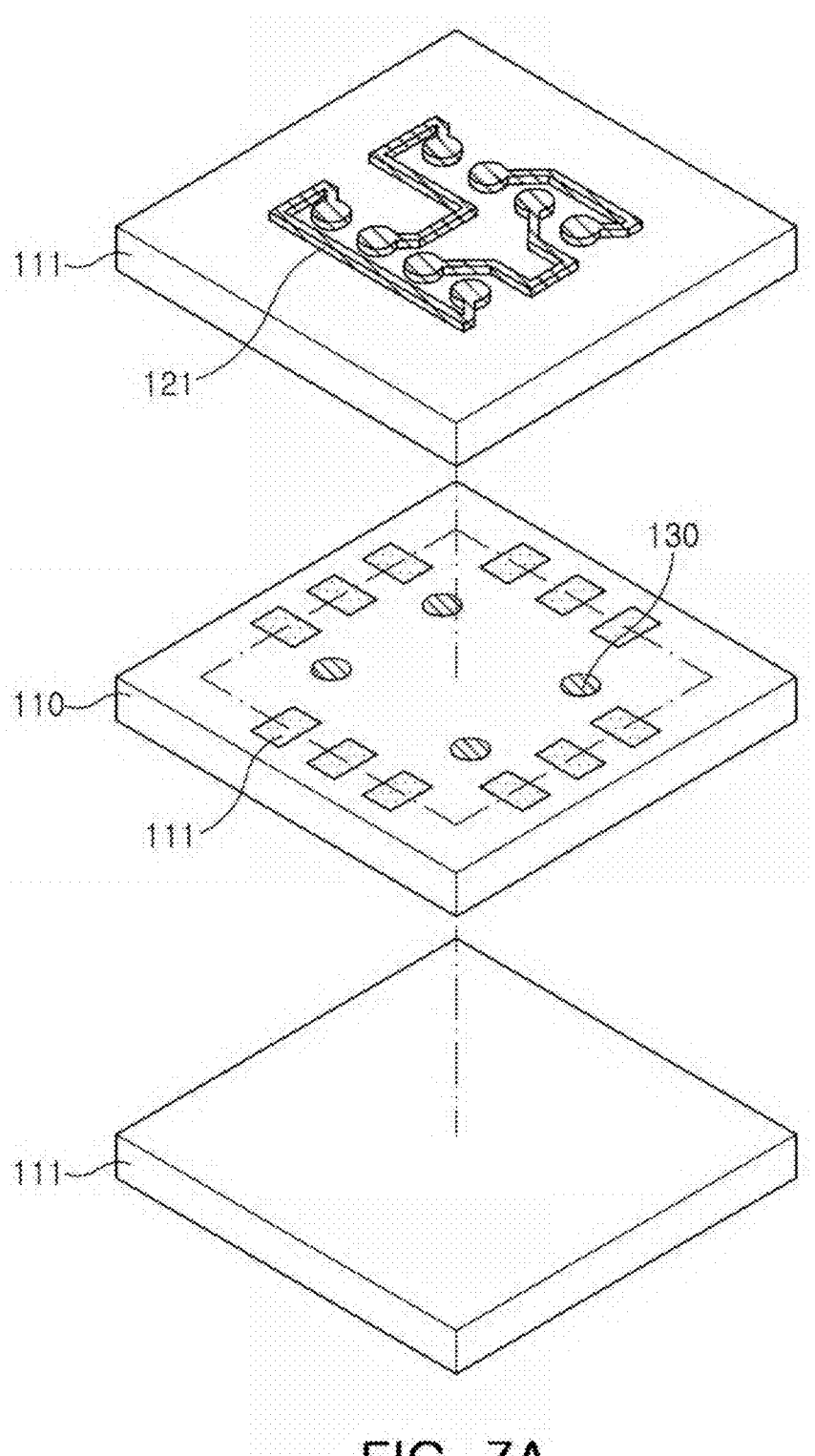
FIGS. 7A to 7D are exploded perspective and cross-sectional views illustrating an operation of forming a first wiring layer in a method of manufacturing a printed circuit board.
Figure 7B:
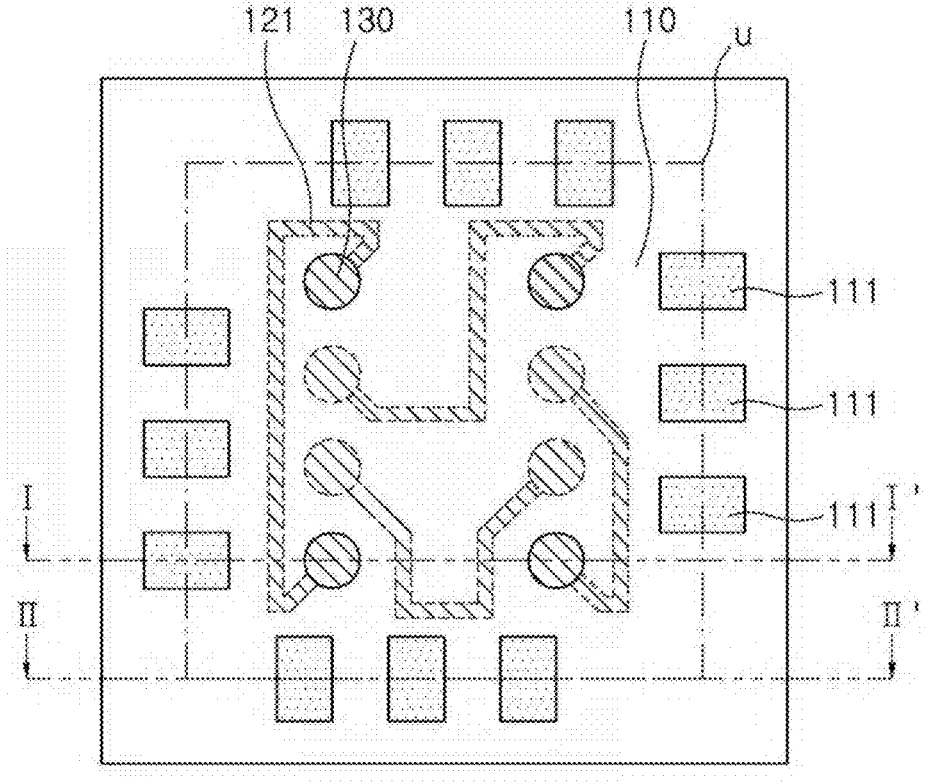
Figure 7C:
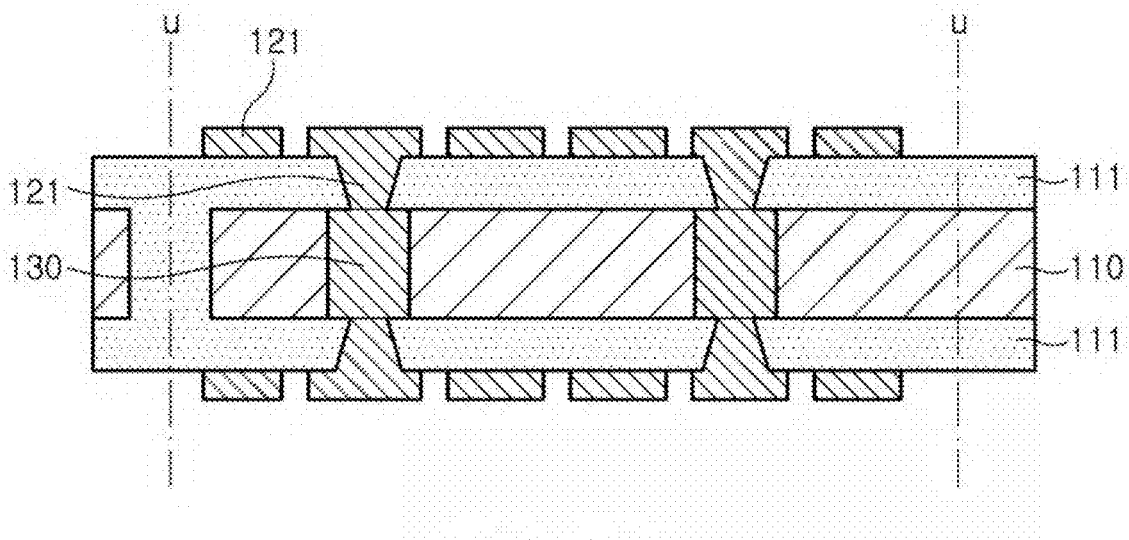
Figure 7D:
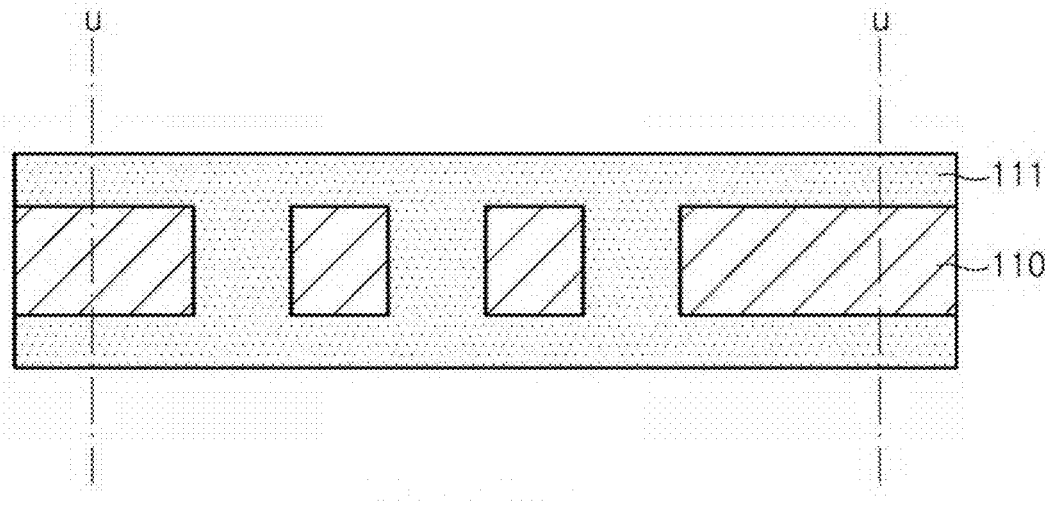

FIGS. 7A to 7D are perspective and cross-sectional views illustrating the operation of forming the first wiring layer 121 in the method of manufacturing a printed circuit board. In detail, FIG. 7A is an exploded perspective view, FIG. 7B is a top-view plan view of the glass layer 110, FIG. 7C is a cross-sectional view taken along line I-I' in FIG. 7B, and FIG. 7D is a cross-sectional view taken along line II-II' in FIG. 7B.

The first wiring layer 121 may be formed simultaneously with the first via layer 131. A via hole penetrating through the first insulating layer 111 may be formed, and after performing electroless plating and electroplating patterning using a plating resist to form the first via layer 131 and the first wiring layer 121, unnecessary parts may be removed, but the present disclosure is not limited thereto. The operation of forming the first wiring layer 121 and the first via layer 131 may be used without limitation as long as it is a known wiring layer and via layer forming process.

FIG. 7B corresponds to a plan view of the glass layer viewed from above, and the first wiring layer 121 formed on the first insulating layer 111 may not be visible. In this case, the first wiring layer 121 may be displayed as a dotted line.

FIG. 7D is a cross-sectional view taken along line II-II' in FIG. 7B, which does not pass through the first wiring layer 121, and thus, the first wiring layer 121 may not be expressed in FIG. 7D.

Figure 8A:
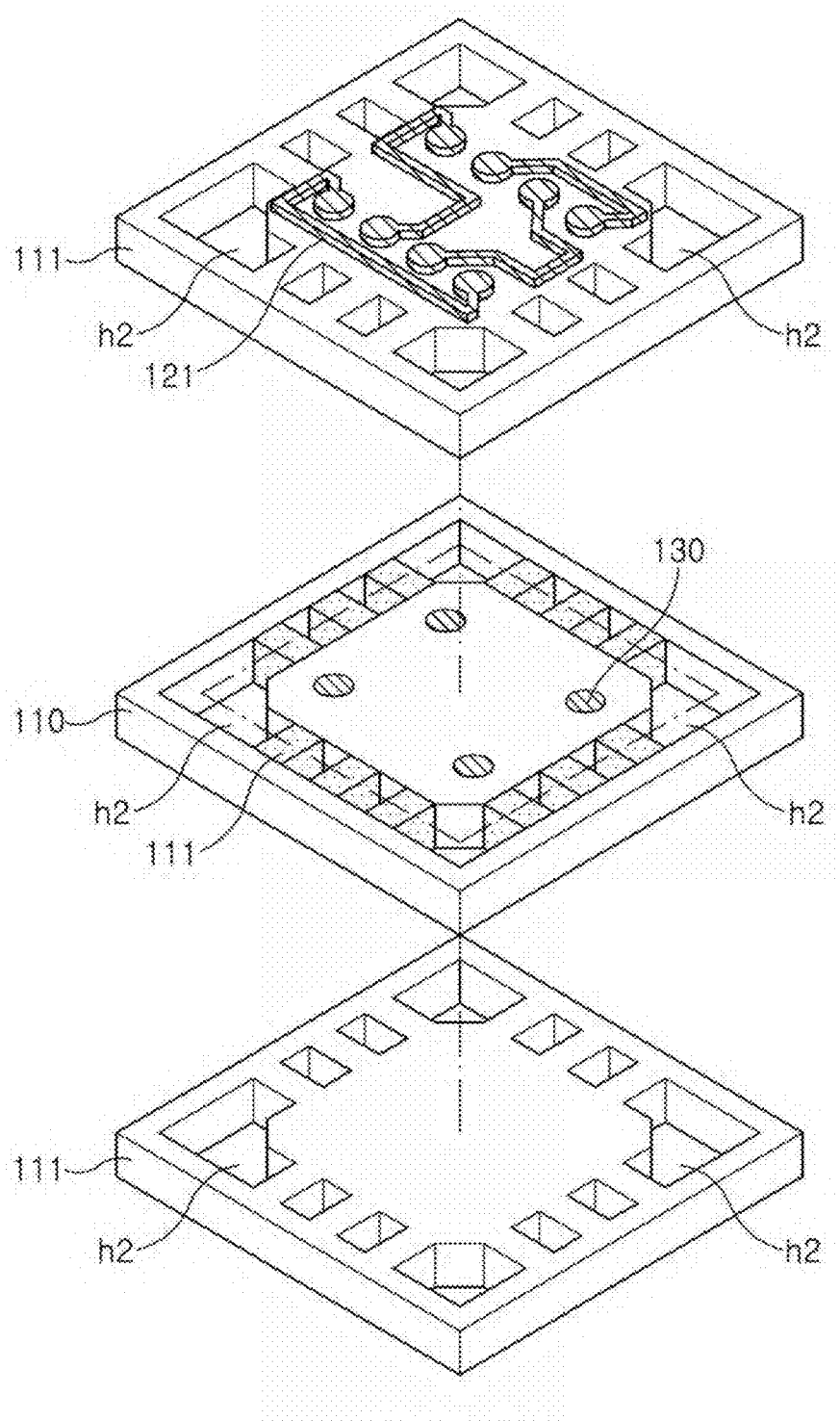
FIGS. 8A to 8D are exploded perspective and cross-sectional views illustrating an operation of forming a second through-hole in a method of manufacturing a printed circuit board.
Figure 8B:
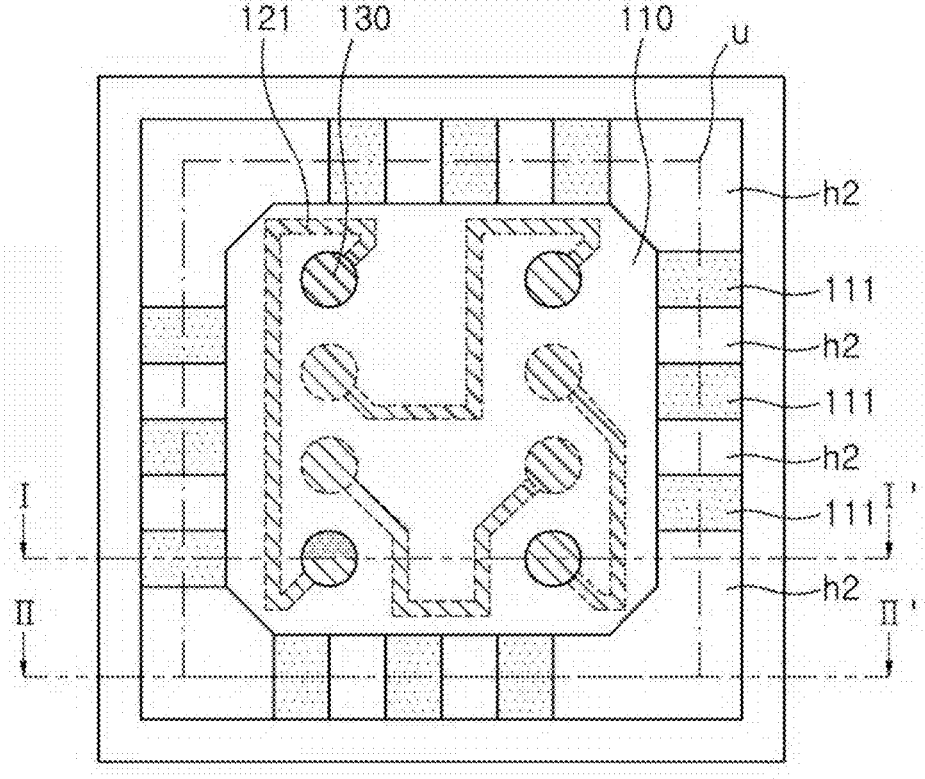
Figure 8C:
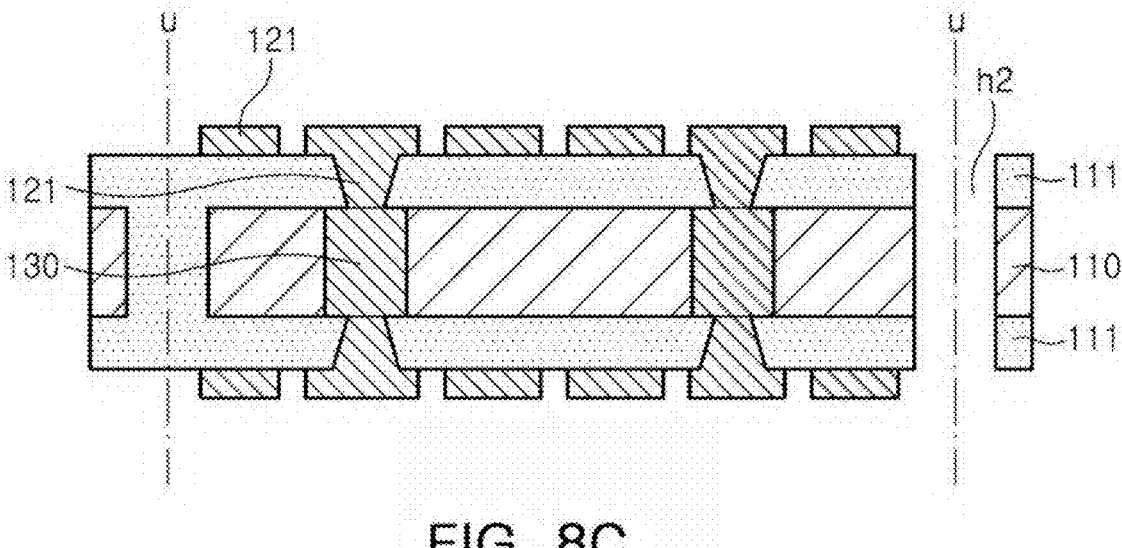
Figure 8D:
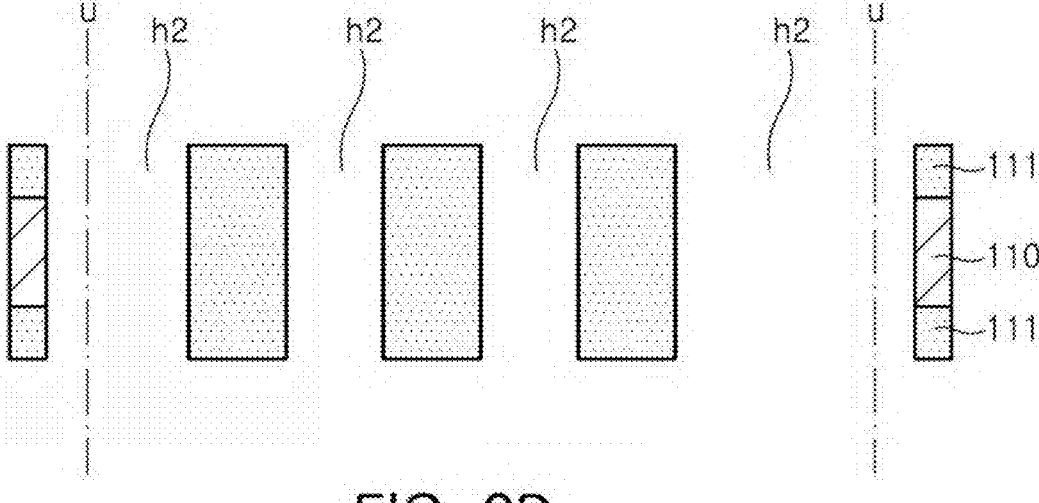

FIGS. 8A to 8D are perspective and cross-sectional views illustrating the second through-hole h2 forming step in the printed circuit board manufacturing method. In detail, FIG. 8A is an exploded perspective view, FIG. 8B is a top-view plan view of the glass layer 110, FIG. 8C is a cross-sectional view taken along line I-I' in FIG. 8B, and FIG. 8D is a cross-sectional view taken along line II-II' in FIG. 8B.

The second through-hole (h2) may penetrate the first insulating layer 111 and the glass layer 110 at once, and the second through-hole h2 may be formed in an area of the glass layer 110 that is not filled with the first insulating layer 111. For example, the second through-hole h2 may be formed to remove the remaining portion of the cutting line u in the glass layer 110. As the first through-hole (h1) is formed to have a constant width and a constant distance, the second through-hole (h2) may be formed to have a constant distance and a constant width to correspond thereto. Therefore, when forming the second through-hole (h2), the glass layer 110 may be separated into unit areas, but the already formed first insulating layer 111 may be connected so that the glass layer 110 is not separated.

The unit area of the glass layer 110 is connected to the dummy area by the remaining portion not removed by the first through-hole h1, and the second through-hole (h2) removes the remaining portion. For example, because the operation of forming the second through-hole h2 is performed with a portion of the glass layer 110 removed from the unit area, since the area of the glass layer 110 that has already been removed plays the role of absorbing stress, damage within the unit area of the glass layer 110 may be reduced.

Referring to FIG. 8B, which is a top-view plan view of the glass layer 110, the inner side surface wall of the second through-hole (h2) may be formed to be inclined at the corner portion area of the cutting line (u). The fact that the second through-hole (h2) is inclined at the corner portion area of the cutting line (u) means that, based on the top-view plan view, the inner sidewall of the second through-hole (h2) or an extension surface thereof does not perpendicularly meet the cutting line (u) for a unit area or a line virtually extended from the cutting line (u). This means that, when the unit area is defined to have a square or rectangular shape with two faces facing in the first direction and two faces facing in the second direction perpendicular to the first direction, the inner sidewall of the through-hole is not perpendicular to the first and second directions. For example, the second through-hole (h2) formed at the corner portion of the cutting line (u) does not have an "L" shape where two arbitrary rectangular shapes intersect each other perpendicularly, and the second through-hole (h2) may be formed to have an inclination in the "L"-shaped bent inner portion so that the corner portions of the glass layer 110 do not intersect at right angles.

When processing the glass layer 110, if the corners of the glass layer 110 are formed so that the side surfaces of the glass layer 110 are perpendicular to each other, there is a risk that the glass layer 110 may be damaged due to stress being concentrated in the corners. As the second through-hole (h2) formed at the corner portion of the cutting line (u) has an inclination, the glass layer 110 has a gentler corner portion and may be better protected from the risk of breakage.

The second through-hole (h2) may be formed by various methods such as laser processing, mechanical processing, and chemical processing. In FIGS. 8A to 8D, the first insulating layer 111 and the glass layer 110 are expressed as penetrating all together, but this is not necessarily limited thereto. After forming a through-hole penetrating through the first insulating layer 111, a second through-hole h2 may be formed correspondingly through the glass layer 110. In this case, the portion penetrating through the first insulating layer 111 and the portion penetrating through the glass layer 110 may be formed to have different widths on the cut surface. The degree of taper may also vary.

Figure 9A:
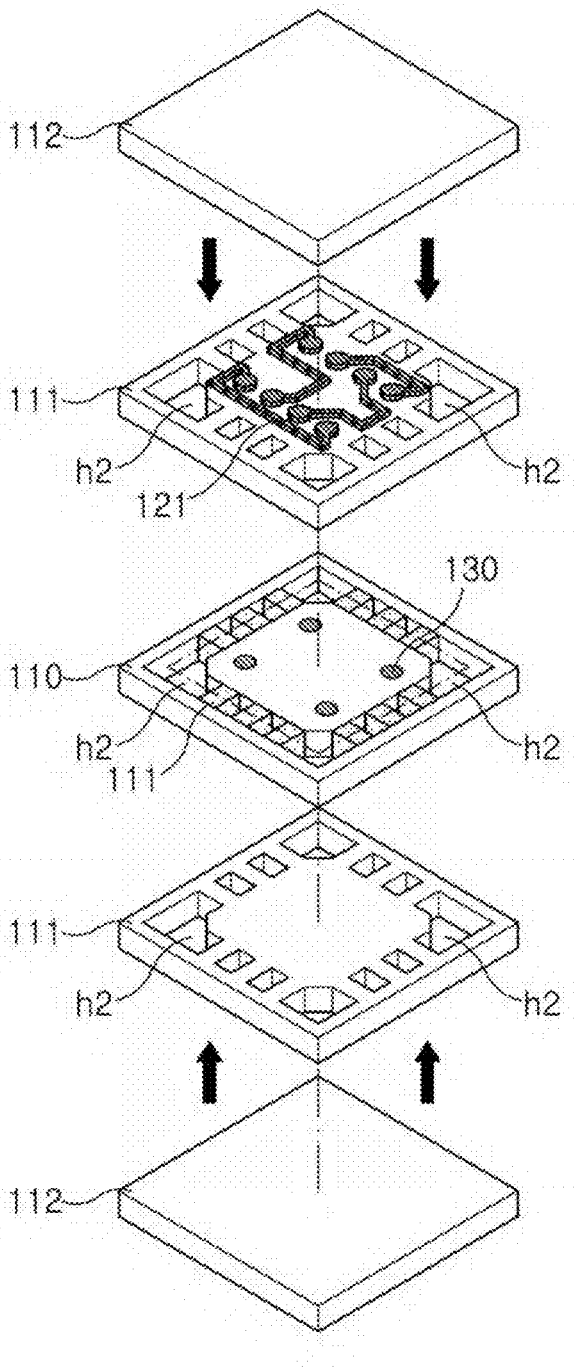
FIGS. 9A to 9D are exploded perspective and cross-sectional views illustrating an operation of forming a second insulating layer in a method of manufacturing a printed circuit board.
Figure 9B:
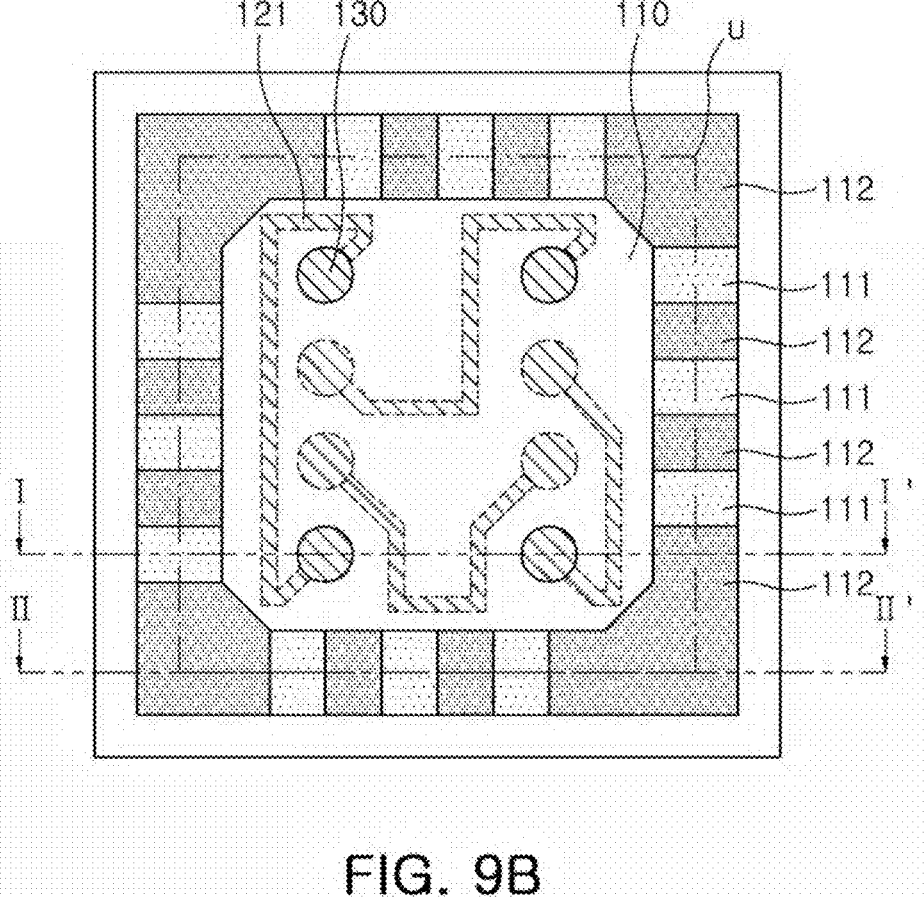
Figure 9C:
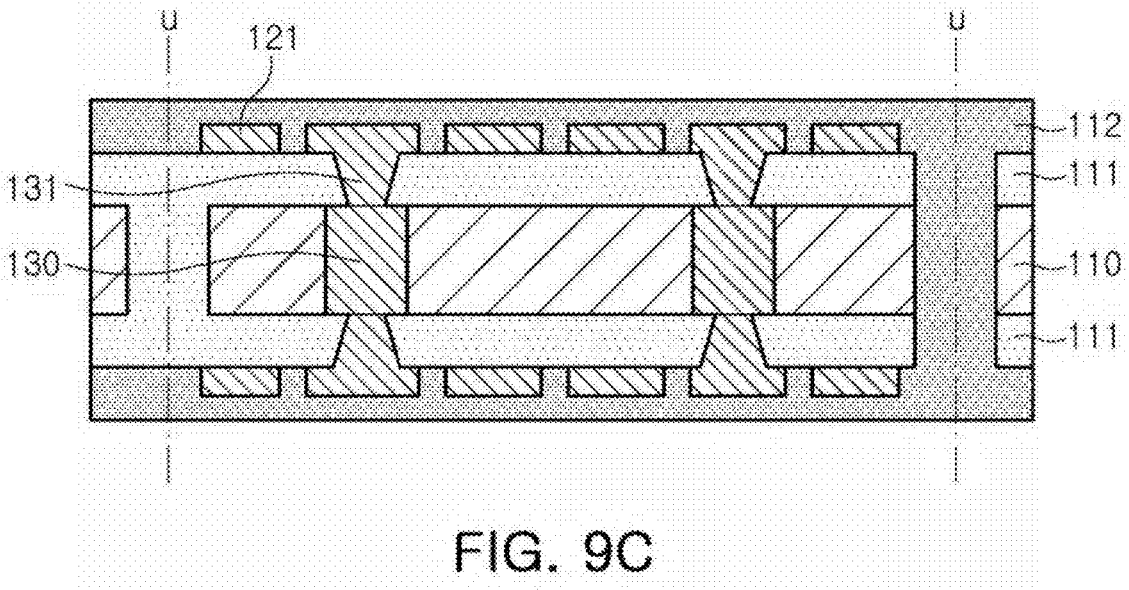
Figure 9D:
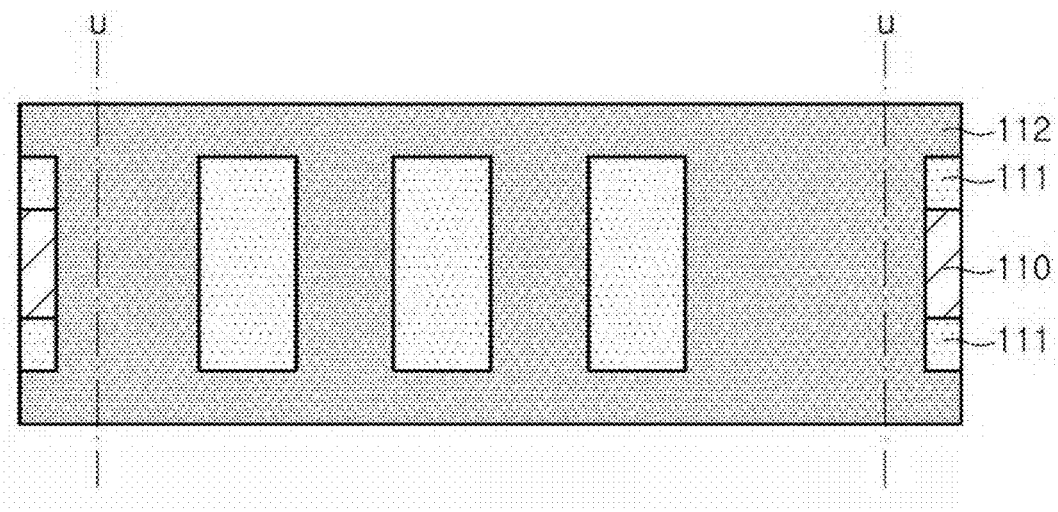

FIGS. 9A to 9D are perspective and cross-sectional views illustrating the operation of forming the second insulating layer 112 in the method of manufacturing a printed circuit board. In detail, FIG. 9A is an exploded perspective view, FIG. 9B is a top-view plan view of the glass layer 110, FIG. 9C is a cross-sectional view taken along line I-I' in FIG. 9b, and FIG. 9D is a cross-sectional view taken along line II-II' in FIG. 9B.

Referring to FIG. 9A, a second insulating layer 112 may be formed above and below the glass layer 110. The second insulating layer 112 may be formed through the same process as the process for forming the first insulating layer 111, but is not limited thereto. The operation of forming the first insulating layer 111 may be performed using a known method of stacking insulating layers on a printed circuit board.

As the second insulating layer 112 is formed to fill the second through-hole h2, a portion of the side surface of the glass layer 110 may be covered by the second insulating layer 112. In detail, referring to FIG. 9D, part of the side surface of the glass layer 110 is covered by the first insulating layer 111, and the remaining portion is covered by the second insulating layer 112.

Figure 10:
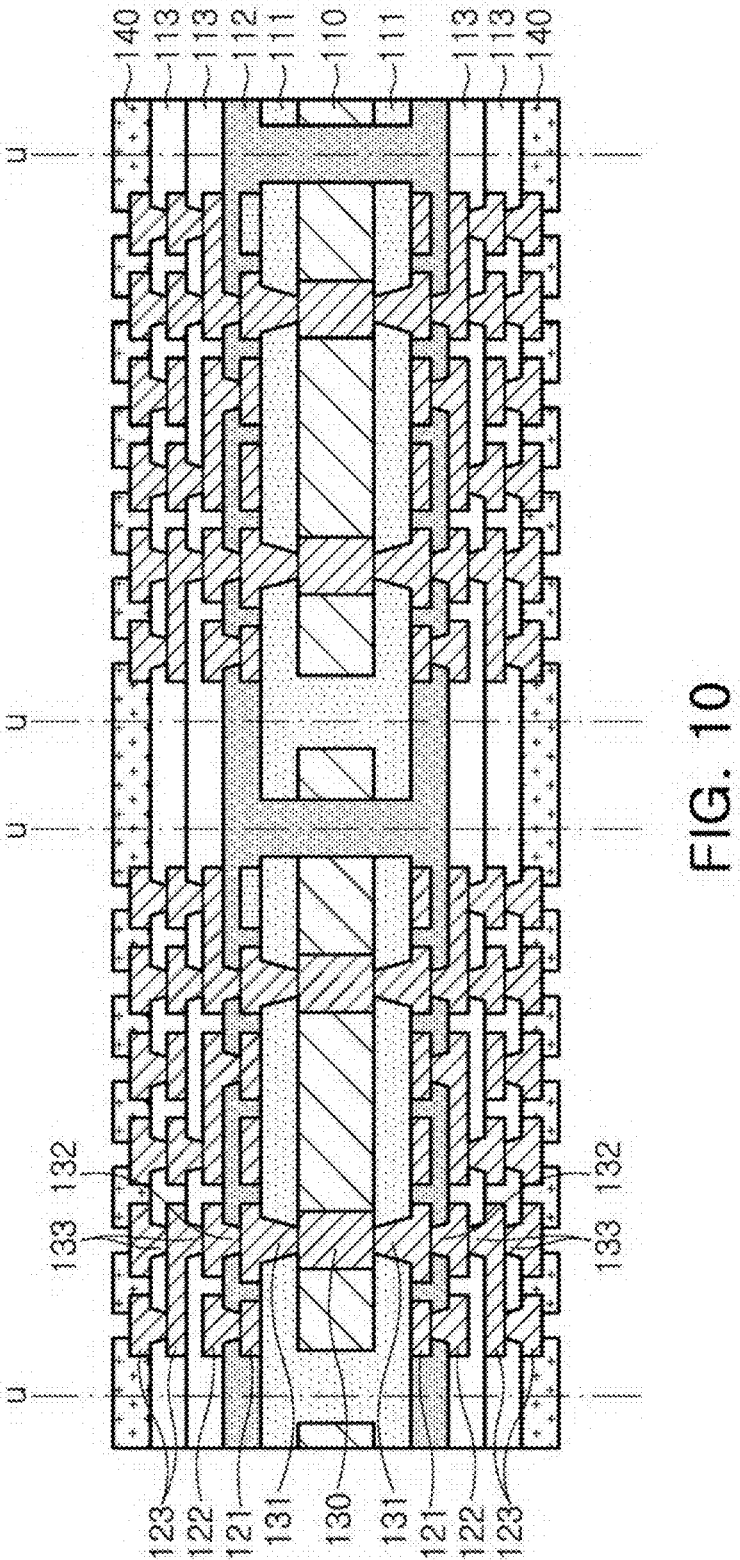
FIG. 10 is a cross-sectional view illustrating an operation of further forming other configurations in a method of manufacturing a printed circuit board.

FIG. 10 is a cross-sectional view illustrating an operation of further forming another configuration in the method of manufacturing a printed circuit board. In detail, FIG. 10 is a cross-sectional view illustrating that the second via layer 132, the second wiring layer 122, the third insulating layer 113, and the third via layer 133 are further formed.

FIG. 10 is expressed based on FIG. 9C, which is a cross-sectional view taken along line I-I' of FIG. 9B. It expresses that part of the glass layer 110 is covered by the first insulating layer 111, and the other part is covered by the second insulating layer 112.

Figure 11:
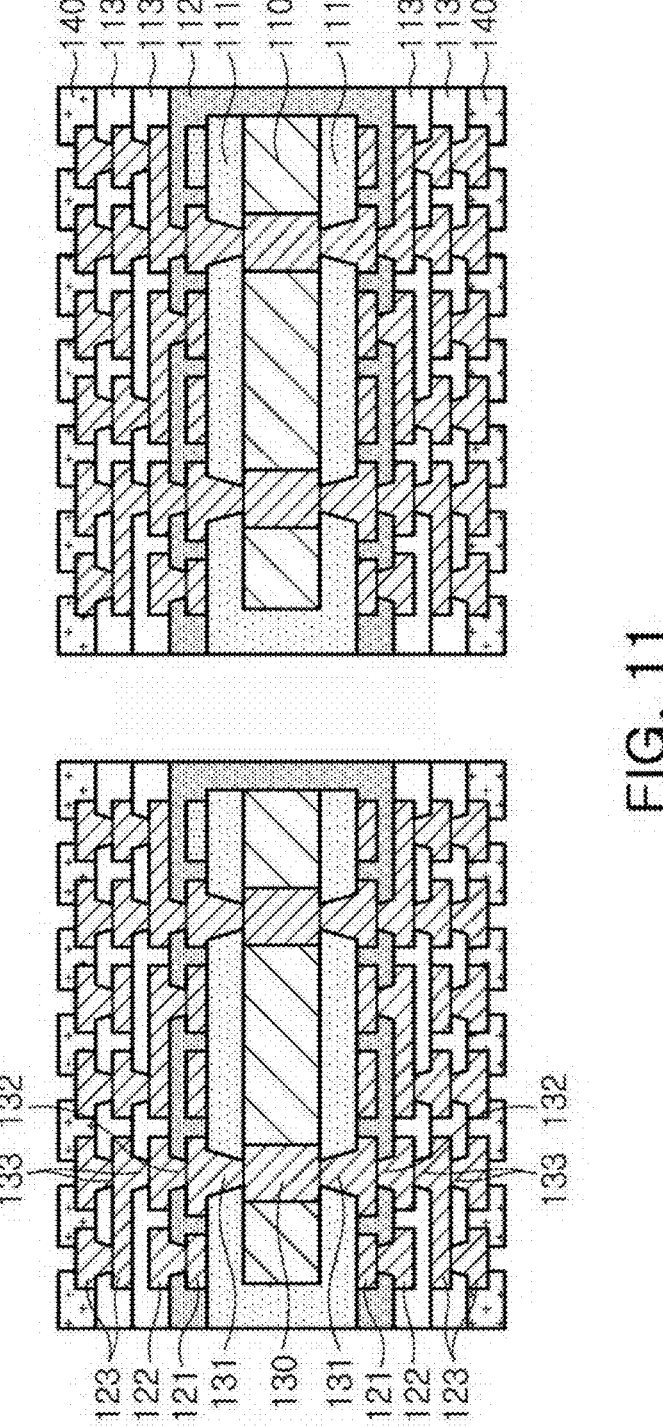
FIG. 11 is a cross-sectional view illustrating an operation of separating a unit area in a method of manufacturing a printed circuit board.

FIG. 11 is a cross-sectional view illustrating the operation of separating unit areas in the printed circuit board manufacturing method.

The printed circuit board is separated into individual unit areas along the cutting line (u), and unnecessary dummy areas may be removed. The operation of separating unit areas may be understood as so-called singulation, and any known method of singulation of strip boards, such as sawing or laser processing, may be used without restrictions.

Printed Circuit Board

FIGS. 12A to 12G are top-view cross-sectional views of the glass layer 110 of each printed circuit board according to various examples as seen from the top. In detail, the stage before singulation is expressed at the top of each drawing. At the bottom, a top-view cross-sectional view of the glass layer 110 of the printed circuit board after singulation is illustrated.

Figure 12A:
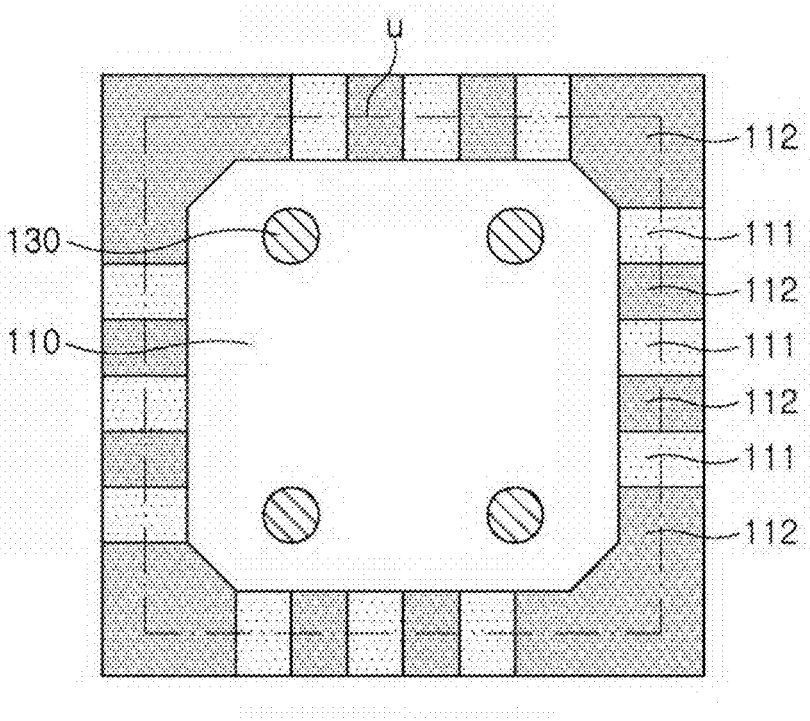
FIGS. 12A to 12G are top-view cross-sectional views of respective glass layers of a printed circuit board according to various examples as seen from the top.
Figure 12A:
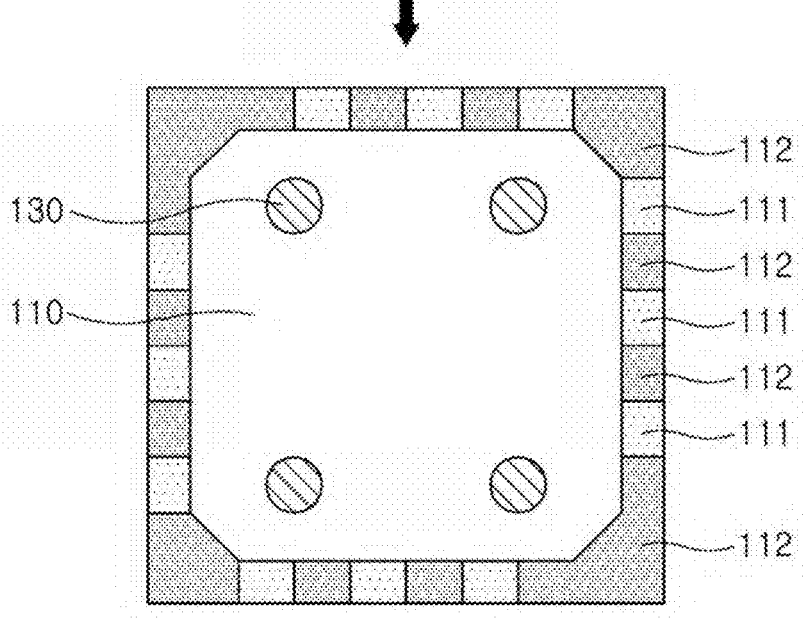

Since FIG. 12A represents a top-view cross-sectional view of the glass layer 110 of a printed circuit board according to an example, redundant description thereof will be omitted.

Figure 12B:
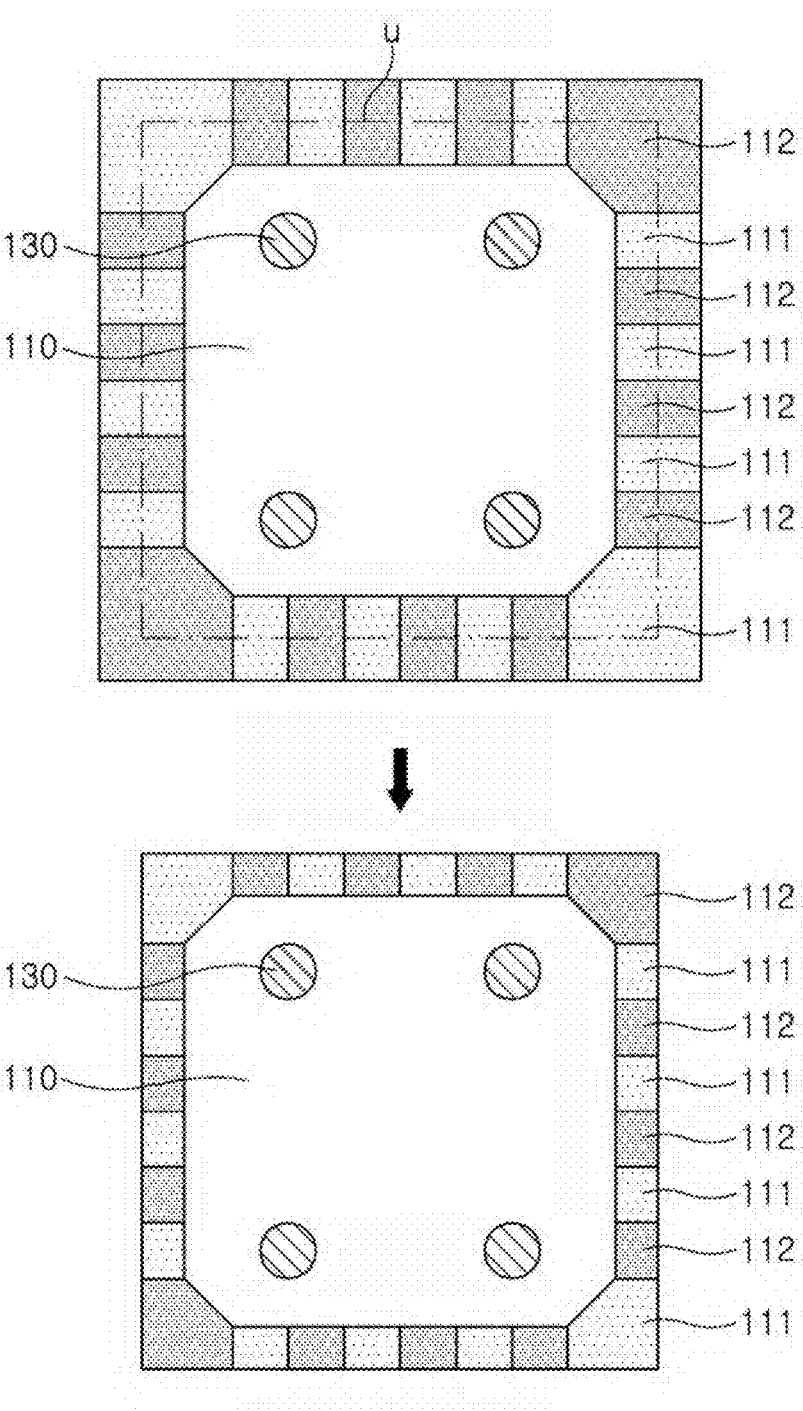

FIG. 12B is a top-view cross-sectional view of the glass layer 110 of a printed circuit board according to another example. Referring to FIG. 12B, some of the corners of the glass layer 110 are covered by the first insulating layer 111. This is the result of forming the first through-hole (h1) at the corner portion of the cutting line (u) when forming the first through-hole (h1). Although the first through-hole (h1) is formed at the corner portion of the cutting line (u), the stress may be distributed because the first through-hole (h1) is formed so as not to extend to the corner portion of the cutting line (u).

Figure 12C:
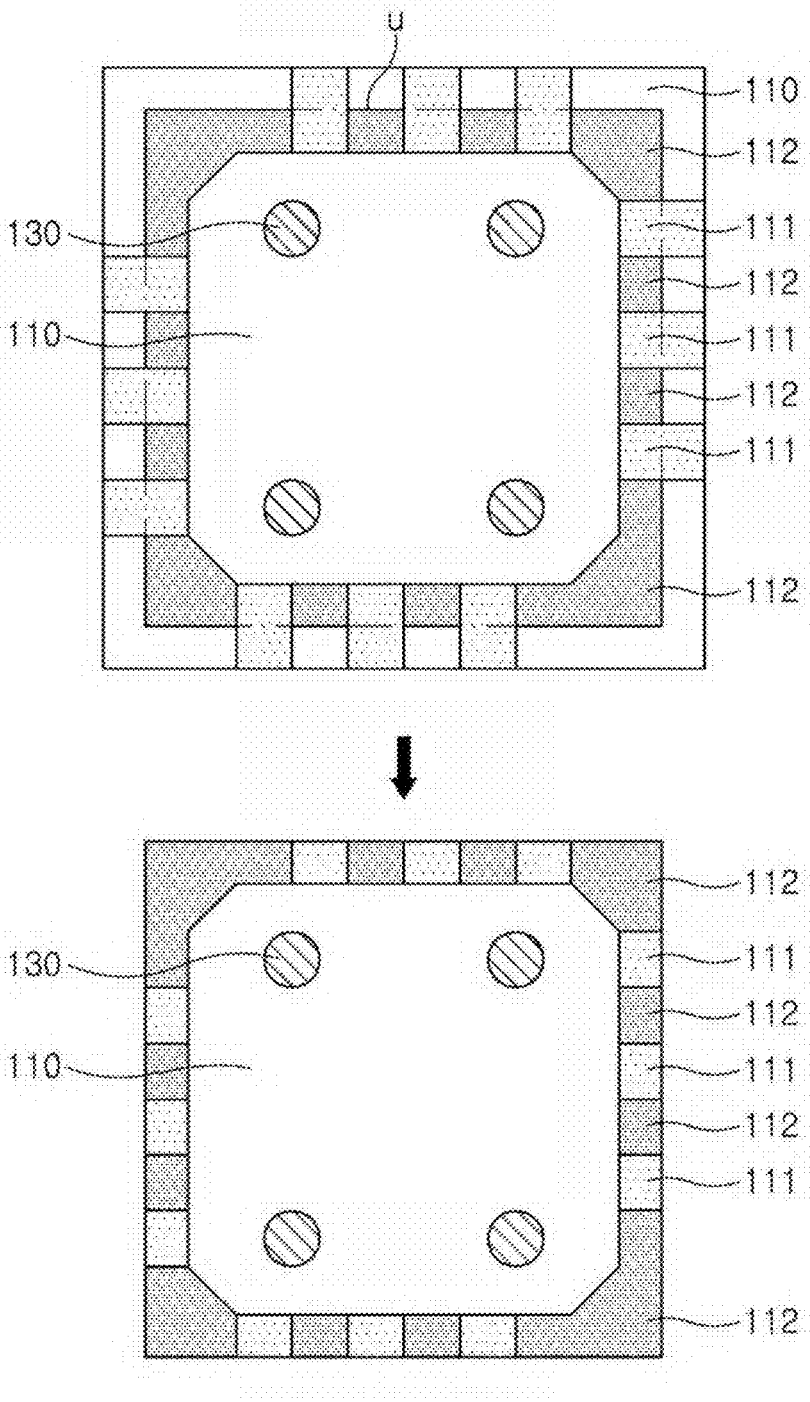

FIG. 12C is a top-view cross-sectional view of the glass layer 110 of a printed circuit board according to another example. Referring to FIG. 12C, the second through-hole (h2) may be formed closer to the cutting line (u), and may be formed to have substantially the same surface as the cutting line (u). For example, since the first through-hole (h1) is formed first and the second through-hole (h2) is formed after forming the first insulating layer 111, the second through-hole h2 only needs to separate the dummy area and the unit area by removing a portion of the glass layer 110. Accordingly, the second through-hole (h2) may not be formed larger, and may be formed as small as the cutting line (u) of the unit area. Therefore, stress may be distributed when forming the second through-hole (h2). As described above, the second insulating layer 112 may be disposed depending on the shape of the second through-hole h2. On the other hand, the printed circuit board according to another example may have the same structure as the printed circuit board according to the example after the singulation process.

Figure 12D:
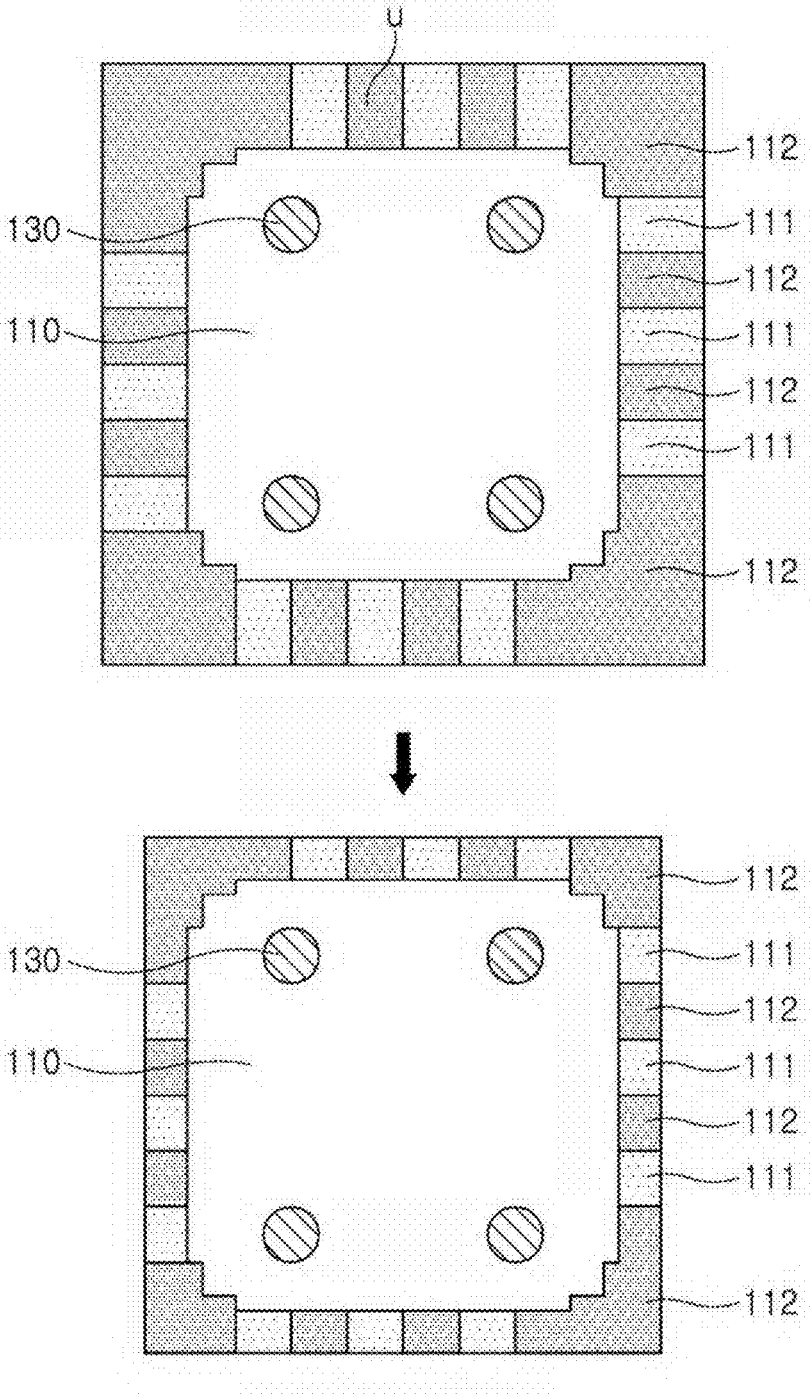

FIG. 12D is a top-view cross-sectional view of the glass layer 110 of a printed circuit board according to another example. Referring to FIG. 12D, the second through-hole h2 formed at the corner portion of the cutting line u may have a step. In detail, referring to FIG. 12D, the second through-hole h2 formed at the corner portion of the cutting line u may include a step of a stepped shape. For example, when the second through-hole (h2) is formed at the corner portion of the cutting line (u), it may have a step of a stepped shape to distribute stress. As described above, the second insulating layer 112 may be disposed according to the shape of the second through-hole h2. The second insulating layer 112 covering the corner portion of the glass layer 110 may also have a step of a stepped shape when viewed from a top-view plan view. At this time, the first corner portion may have a plurality of first corner portion surfaces, and the first corner portion may include an edge where the first side surface and the first corner portion surface contact each other, and an edge where a plurality of first corner portion surfaces contact each other in addition to an edge where the third side surface and the first corner portion surface contact each other. For example, the first corner portion may have a plurality of corner portion surfaces between the first side surface and the third side surface that may be distinguished from the first side surface and the third side surface. On the other hand, of course, the description regarding the first corner portion may be applied to the second to fourth corner portions in the same sense. In FIG. 12D, each corner portion is illustrated as having three inflection points, but is not limited thereto, and may have more inflection points and more steps. On the other hand, as the number of inflection points increases, the stress acting on the glass layer 110 during through-hole processing may be distributed, and thus a structure that is more advantageous against breakage may be obtained. On the other hand, the content is not limited to what is illustrated in FIG. 12D, and the first corner portion may have a curved surface. When the first corner portion has a curved surface, as described above in the printed circuit board according to an example, discontinuous positions on the first side surface and the third side surface may be understood as corners, and the inflection point formed between curved surfaces may be understood as an edge. On the other hand, of course, the corner portion shape of the printed circuit board glass layer 110 according to another example may also be applied to the printed circuit board according to another example illustrated in FIG. 12B.

Figure 12E:
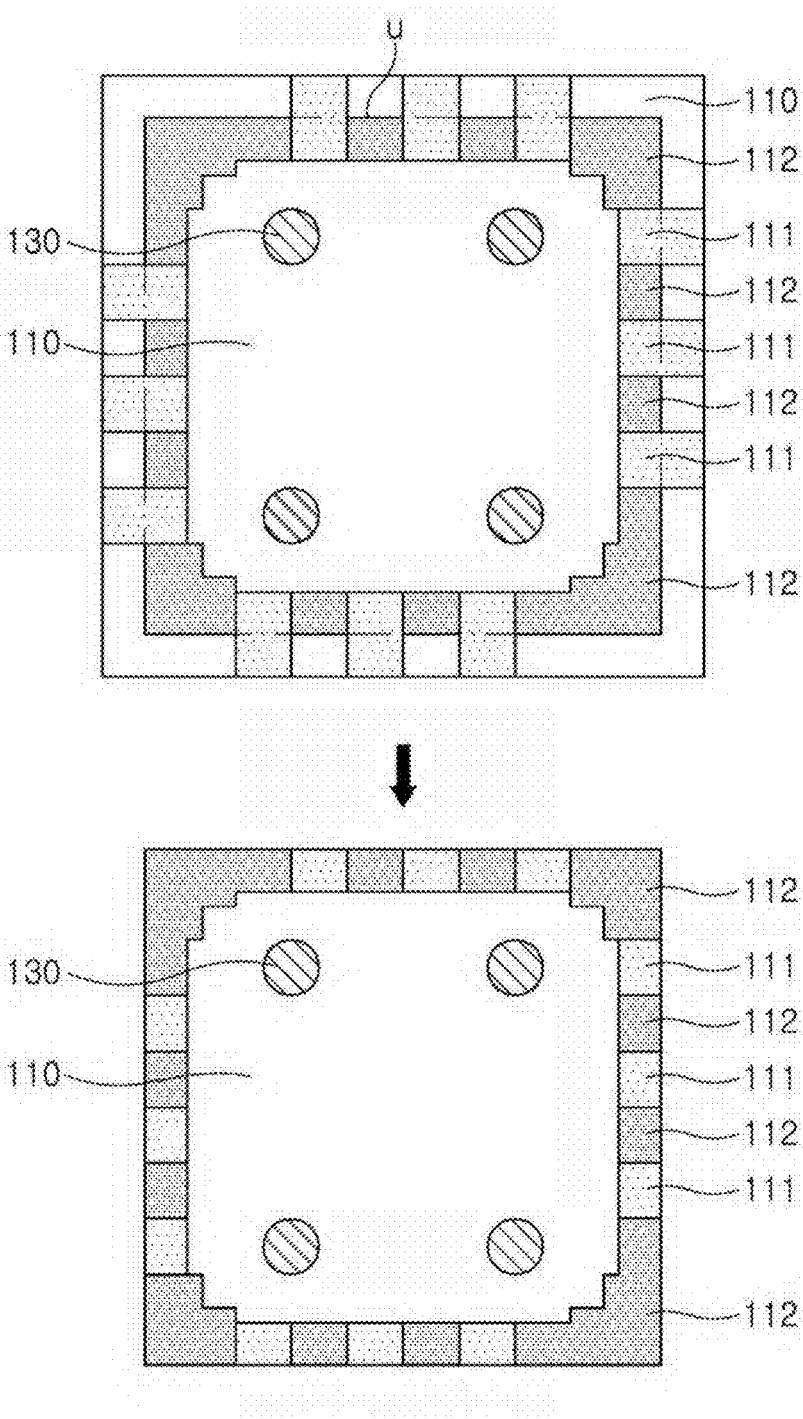

FIG. 12E is a top-view cross-sectional view of the glass layer 110 of a printed circuit board according to another example. Referring to FIG. 12E, the second through-hole (h2) may be formed closer to the cutting line (u), and the second through-hole (h2) formed at the corner portion of the cutting line (u) may include a step of a stepped shape. This is an example in which the configuration of the printed circuit board according to another example illustrated in FIG. 12C and the printed circuit board according to another example illustrated in FIG. 12D are applied. On the other hand, the printed circuit board according to another example may have the same structure as the printed circuit board according to another example illustrated in FIG. 12D after the singulation process.

Figure 12F:
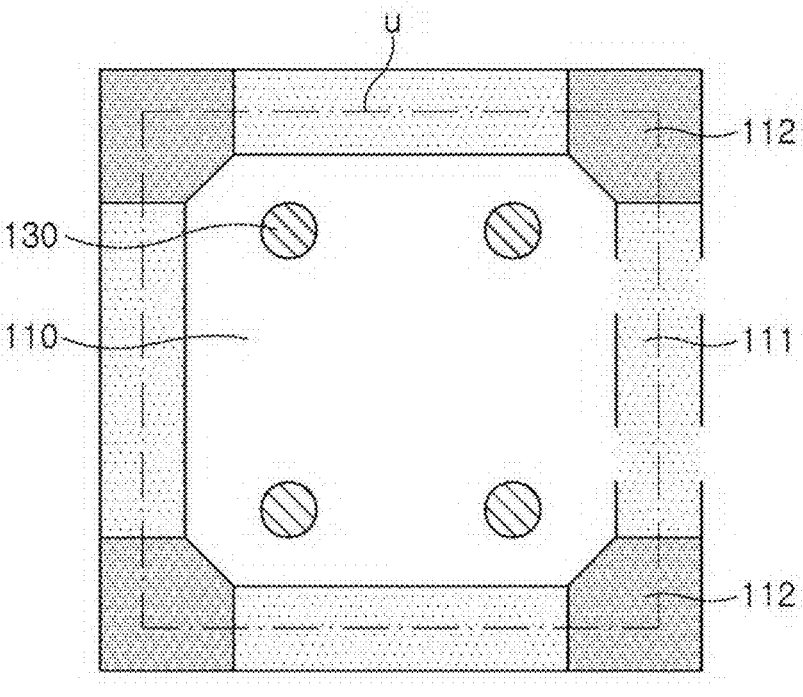
Figure 12F:
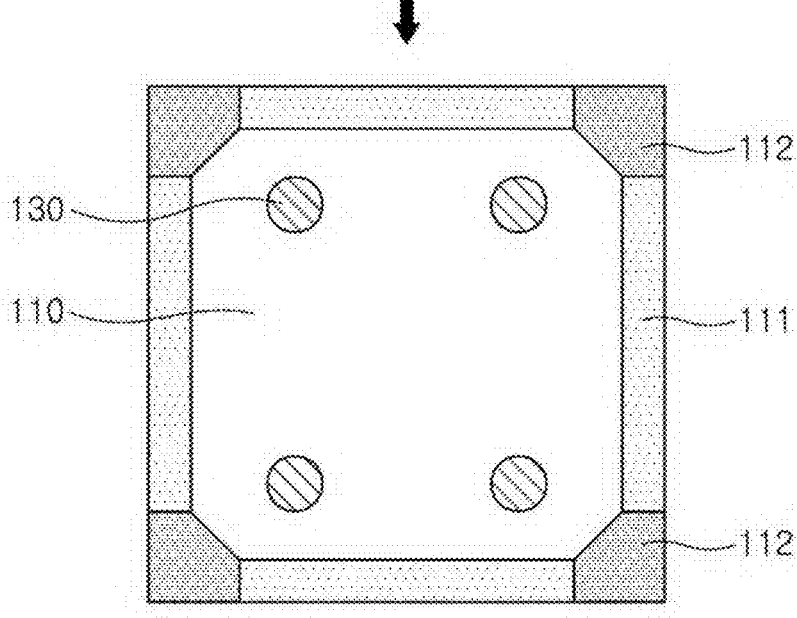

FIG. 12F is a top-view cross-sectional view of the glass layer 110 of a printed circuit board according to another example. Referring to FIG. 12F, the side surface of the glass layer 110 may be covered by the first insulating layer 111, and the corner portion of the glass layer 110 may be covered by the second insulating layer 112. The corner portion of the glass layer may be formed to form an obtuse angle with the side surface of the glass layer 110. In the printed circuit board according to an example, the second through-hole (h2) does not extend to the edge region of the cutting line (u), and thus the second insulating layer 112 may cover the corner portion of the glass layer 110, and only the corner portion of the glass layer 110 may be covered. Of course, since the glass layer 110 does not have orthogonal "L" corners, the effect of stress distribution may be obtained.

Figure 12G:
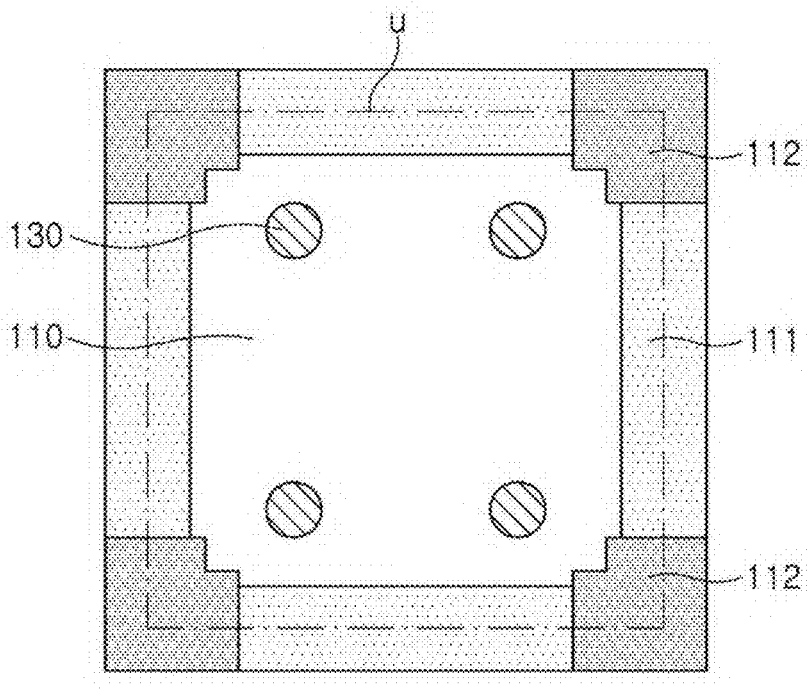
Figure 12G:
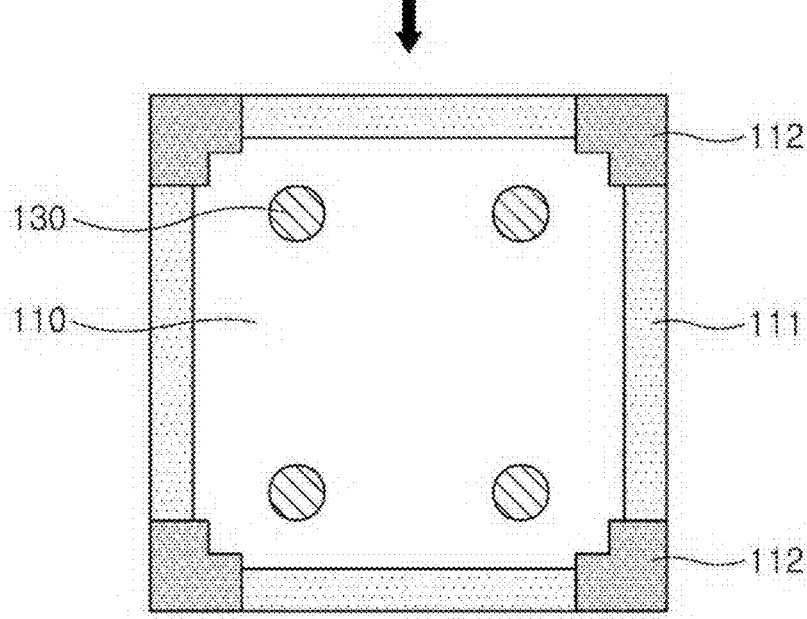

FIG. 12G is a top-view cross-sectional view of the glass layer 110 of a printed circuit board according to another example. Referring to FIG. 12G, this is an example in which the shape of the corner portion of the glass layer 110 is modified in the printed circuit board according to another example illustrated in FIG. 12F. The second through-hole (h2) formed at the corner portion of the cutting line (u) may include a step of a stepped shape, and accordingly, the second insulating layer 112 covering the corner portion of the glass layer 110 may include step of a stepped shapes.

On the other hand, in the printed circuit board according to various examples of FIGS. 12A to 12G, descriptions other than the description of the shape of the glass layer, the arrangement of the first insulating layer 111 and the second insulating layer 112, etc. may be applied in the same manner as the description in the printed circuit board and the manufacturing method of the printed circuit board according to the example, and therefore, redundant explanations are omitted.

As set forth above, according to an embodiment, a printed circuit board including a glass layer and a method of manufacturing the printed circuit board may be provided.

A printed circuit board with a low probability of damage even when singulated, and a method of manufacturing the printed circuit board, may be provided.

A printed circuit board and a method of manufacturing the printed circuit board, in which reliability may be improved, may be provided.

In the present disclosure, the expression to cover and the expression to cover may include not only the case of covering the whole, but also the case of covering at least part of the case, and may also include cases of direct covering as well as indirect covering. In addition, the expression to fill may include not only completely filling but also approximately filling. For example, this may include cases where some voids or voids exist.

In the present disclosure, the judgment may actually include process errors, position deviations, errors during measurement, etc. that occur during the manufacturing process. For example, substantially vertical may include not only completely vertical, but also approximately vertical. In addition, being substantially coplanar may include not only cases of being completely on the same plane, but also cases of being approximately on the same plane.

In the present disclosure, the same insulating material may mean not only the exact same insulating material but also including the same type of insulating material. Therefore, the composition of the insulating materials is substantially the same, but their specific composition ratios may vary slightly.

In the present disclosure, the meaning of cross-section may mean the cross-sectional shape when the object is cut vertically, the cross-sectional shape when the object is cut vertically, or the cross-sectional shape when the object is viewed from a side surface view. In addition, the meaning on a plane may mean a plane shape when the object is cut horizontally, or a plane shape when the object is viewed from a top-view or bottom-view.

In the present disclosure, lower side, lower portion, bottom, lower surface, and the like are used for convenience to mean a downward direction based on the cross section of the drawing. Upper side, upper portion, upper surface, top, and the like are used to mean the opposite direction. However, this direction is for defined convenience of explanation, and it goes without saying that the scope of the patent claims is not particularly limited by the description of this direction. The concept of top/bottom may change at any time.

In the present disclosure, the meaning of connected is a concept that includes not only directly connected, but also indirectly connected through an adhesive layer or the like. In addition, the meaning of being electrically connected is a concept that includes both cases where it is physically connected and cases where it is not connected. Additionally, expressions such as first, second, etc. are used to distinguish one component from another component and do not limit the order and/or importance of the components. In some cases, the first component may be named the second component without departing from the scope of rights, and similarly, the second component may be named as the first component.

The expression 'example' used in the present disclosure does not mean identical embodiments, but is provided to emphasize and explain different unique features. However, the examples presented above do not exclude being implemented in combination with features of other examples. For example, even if what is described in an example is not described in another example, unless there is a contrary or contradictory explanation in another example, it may be understood as an explanation related to another example.

The terminology used in this disclosure is used to describe examples only and is not intended to limit the disclosure. At this time, singular expressions include indicates plural expressions, unless the context clearly otherwise.

While example embodiments have been illustrated and described above, it will be apparent to those skilled in the art that modifications and variations could be made without departing from the scope of the present invention as defined by the appended claims.

What is claimed is:

1. A printed circuit board comprising:
a glass layer having a first side surface and a second side surface, opposing each other in a first direction, a third side surface and a fourth side surface, opposing each other in a second direction, perpendicular to the first direction, a first corner portion connecting the first side surface and the third side surface to each other, a second corner portion connecting the first side surface and the fourth side surface to each other, a third corner portion connecting the second side surface and the third side surface to each other, and a fourth corner portion connecting the second side surface and the fourth side surface to each other; a first insulating layer disposed on the glass layer and covering at least a portion of at least one side surface of the first to fourth side surfaces; and
a second insulating layer disposed on the first insulating layer and covering at least one of the first to fourth corner portions, wherein a portion of the at least one side surface of the first to fourth side surfaces is covered by the first insulating layer, and another portion thereof is covered by the second insulating layer.

2. The printed circuit board of claim 1, wherein the first to fourth corner portions are covered by the second insulating layer.

3. The printed circuit board of claim 1, wherein the first insulating layer and the second insulating layer are alternately disposed on the at least one of the first to fourth side surfaces.

4. The printed circuit board of claim 1, wherein on a plane, the at least one of the first to fourth corner portions is inclined.

5. The printed circuit board of claim 4, wherein on a plane, the at least one of the first to fourth corner portions has an obtuse angle with the at least one of the first to fourth side surfaces.

6. The printed circuit board of claim 1, wherein on a plane, the at least one corner portion of the first to fourth corner portions has a step.

7. The printed circuit board of claim 1, wherein the first insulating layer and the second insulating layer include the same material, wherein the first insulating layer and the second insulating layer have an interlayer boundary with each other.

8. The printed circuit board of claim 1, further comprising:
a through-via penetrating through the glass layer; a first wiring layer disposed on the first insulating layer; a first via layer penetrating through the first insulating layer to connect the first wiring layer and the through-via to each other; a second wiring layer disposed on the second insulating layer; and a second via layer penetrating through the second insulating layer to connect the second wiring layer and the first wiring layer to each other.

9. The printed circuit board of claim 8, further comprising: a third insulating layer disposed on the second insulating layer; a third wiring layer disposed on the third insulating layer; and a third via layer penetrating through the third insulating layer to connect the third wiring layer and the second wiring layer to each other.

10. A printed circuit board comprising:
a glass layer having a first side surface and a second side surface, opposing each other in a first direction, a third side surface and a fourth side surface, opposing each other in a second direction, perpendicular to the first direction, a first corner portion connecting the first side surface and the third side surface to each other, a second corner portion connecting the first side surface and the fourth side surface to each other, a third corner portion connecting the second side surface and the third side surface to each other, and a fourth corner portion connecting the second side surface and the fourth side surface to each other; and an insulating material disposed on the glass layer and covering the first to fourth side surfaces and the first to fourth corner portions, wherein at least one of the first to fourth corner portions has a plurality of edges, the first corner portion includes a first corner portion surface in contact with the first side surface and the third side surface, and the plurality of edges include an edge where the first corner portion surface is in contact with the first side surface and another edge where the first corner portion surface is in contact with the third side surface.

11. The printed circuit board of claim 10, wherein the first corner portion includes a plurality of first corner portion surfaces in contact with the first side surface and the third side surface, respectively, or in contact with each other, and the plurality of edges include an edge where the plurality of first corner portion surfaces contact each other.

12. The printed circuit board of claim 10, wherein on a plane, the at least one of the first to fourth corner portions has an inclination.

13. The printed circuit board of claim 10, wherein on a plane, the at least one of the first to fourth corner portions has a step.

14. The printed circuit board of claim 13, wherein in a cross section in the direction perpendicular to a stacking direction, the step includes a stepped shape.

15. The printed circuit board of claim 10, wherein the insulating material includes a first insulating material disposed on the glass layer, and a second insulating material disposed on the first insulating material, the first insulating material covers a portion of the first to fourth side surfaces and the first to fourth corners corner portions of the glass layer, and the second insulating material covers remaining portions of the first to fourth side surfaces and the first to fourth corners corner portions of the glass layer.

16. The printed circuit board of claim 10, further comprising:
a through-via penetrating through the glass layer; a wiring layer disposed on or within the insulating material; and a via layer penetrating through at least a portion of the insulating material to connect the wiring layer and the through-via to each other.

17. A printed circuit board comprising: a glass layer having an upper surface and a lower surface opposing each other in one direction and a first side surface and a second side surface opposing each other in another direction; a first insulating layer disposed on the glass layer to cover the upper surface and a portion of the first and second side surfaces; a second insulating layer disposed on the first insulating layer and extending to cover another portion of the first and second side surfaces; a through-via penetrating through the glass layer; a first wiring layer disposed on the first insulating layer and covered by the second insulating layer; and a first via penetrating through the first insulating layer to connect the first wiring layer and the through-via to each other, wherein at an interface of the first via and the through-via, a width of the first via is different from a width of the through-via.

18. The printed circuit board of claim 17, further comprising:

a second wiring layer disposed on the second insulating layer; and a second via layer penetrating through the second insulating layer to connect the second wiring layer and the first wiring layer to each other.

19. The printed circuit board of claim 17, wherein the first insulating layer is in contact with the upper surface and the portion of the first and second side surfaces, and the second insulating layer is in contact with the another portion of the first and second side surfaces.

20. The printed circuit board of claim 19, wherein among the first and second insulating layers, only the first insulating layer is in contact with the upper surface.

21. The printed circuit board of claim 17, wherein an inclined angle of the first via with respect to the upper surface is different from an inclined angle of the through-via with respect to the upper surface.

22. The printed circuit board of claim 17, wherein the first via has a tapered shape having a width decreasing in a direction toward the through-via.

23. The printed circuit board of claim 17, wherein the first insulating layer extends from the portion of the first and second side surfaces to cover the lower surface, and a second insulating layer extends from the another portion of the first and second side surfaces to cover a portion of first insulating layer which covers the lower surface.

24. The printed circuit board of claim 17, further comprising another via penetrating through the portion of first insulating layer which covers the lower surface and being connected to the through-via, wherein at an interface of the another via and the through-via, a width of the another via is different from that of the through-via.

25. The printed circuit board of claim 24, wherein the first via and the another via have tapered shapes tapered in opposite directions.

26. The printed circuit board of claim 17, wherein the glass layer is spaced apart from an exterior surface of the printed circuit board.

27. The printed circuit board of claim 17, wherein at the interface of the first via and the through-via, the width of the first via is less than the width of the through-via.

\* \* \* \* \*